US012683571B2

(12) United States Patent
Goto et al.

(10) Patent No.: US 12,683,571 B2
(45) Date of Patent: Jul. 14, 2026

(54) HEAT DISSIPATION STRUCTURE FOR LATERALLY EXCITED BULK ACOUSTIC WAVE DEVICE

(71) Applicant: Skyworks Solutions, Inc., Irvine, CA (US)

(72) Inventors: Rei Goto, Osaka (JP); Hironori Fukuhara, Ibaraki (JP)

(73) Assignee: Skyworks Solutions, Inc., Irvine, CA (US)

( * ) Notice: Subject to any disclaimer, the term of this patent is extended or adjusted under 35 U.S.C. 154(b) by 918 days.

(21) Appl. No.: 18/046,377

(22) Filed: Oct. 13, 2022

(65) Prior Publication Data

US 2023/0123285 A1 Apr. 20, 2023

Related U.S. Application Data

(60) Provisional application No. 63/256,338, filed on Oct. 15, 2021.

(51) Int. Cl.
*H03H 9/02* (2006.01)
*H03H 9/13* (2006.01)
(Continued)

(52) U.S. Cl.
CPC .... *H03H 9/02102* (2013.01); *H03H 9/02015* (2013.01); *H03H 9/133* (2013.01);
(Continued)

(58) Field of Classification Search
CPC ........... H03H 9/02102; H03H 9/02015; H03H 9/133; H03H 9/173; H03H 9/174; H03H 9/568; H03H 9/02228; H03H 9/02157
See application file for complete search history.

(56) References Cited

U.S. PATENT DOCUMENTS

| | | | | |
|---|---|---|---|---|
| 4,157,269 A | * | 6/1979 | Ning | H01L 21/033 |
| | | | | 438/362 |
| 4,312,228 A | * | 1/1982 | Wohltjen | G01N 29/022 |
| | | | | 73/23.31 |

(Continued)

FOREIGN PATENT DOCUMENTS

| | | | | |
|---|---|---|---|---|
| CN | 116683884 A | * | 9/2023 | H03H 9/02228 |
| JP | 2856778 B2 | * | 2/1999 | H01L 23/4821 |

(Continued)

OTHER PUBLICATIONS

U.S. Appl. No. 18/046,388, filed Oct. 13, 2022, Laterally Excited Bulk Acoustic Wave Device With Thermally Conductive Layer.

(Continued)

*Primary Examiner* — Pedro J Cuevas
(74) *Attorney, Agent, or Firm* — Knobbe, Martens, Olson & Bear, LLP

(57) ABSTRACT

An acoustic wave device is disclosed. The acoustic wave deice can include a membrane structure and a support substrate. The membrane structure includes a piezoelectric layer, an interdigital transducer electrode arranged on the piezoelectric layer, and a thermally conductive layer arranged at least partially in contact with the piezoelectric layer. The support substrate is connected to the membrane structure and configured such that a cavity is provided next to the membrane structure. The acoustic wave device can laterally excite a bulk acoustic wave.

20 Claims, 17 Drawing Sheets

(51) Int. Cl.
  *H03H 9/17*  (2006.01)
  *H03H 9/56*  (2006.01)
(52) U.S. Cl.
  CPC ............ *H03H 9/173* (2013.01); *H03H 9/174* (2013.01); *H03H 9/568* (2013.01)

(56)           References Cited

U.S. PATENT DOCUMENTS

| | | | | |
|---|---|---|---|---|
| 4,812,896 | A * | 3/1989 | Rothgery | H01L 23/10 |
| | | | | 174/559 |
| 5,041,902 | A * | 8/1991 | McShane | H01L 23/367 |
| | | | | 257/E23.047 |
| 5,221,642 | A * | 6/1993 | Burns | H01L 23/49513 |
| | | | | 29/827 |
| 5,235,204 | A * | 8/1993 | Tsai | H10D 30/0273 |
| | | | | 257/E21.507 |
| 5,324,683 | A * | 6/1994 | Fitch | G01P 15/0802 |
| | | | | 438/619 |
| 5,369,040 | A * | 11/1994 | Halvis | H10D 84/0198 |
| | | | | 438/587 |
| 5,920,121 | A * | 7/1999 | Forbes | H01L 23/53252 |
| | | | | 257/E23.162 |
| 6,100,176 | A * | 8/2000 | Forbes | H01L 23/53252 |
| | | | | 438/622 |
| 6,121,126 | A * | 9/2000 | Ahn | H01L 21/76877 |
| | | | | 438/770 |
| 6,143,655 | A * | 11/2000 | Forbes | H01L 21/76877 |
| | | | | 257/E21.585 |
| 6,201,292 | B1 * | 3/2001 | Yagi | H01L 21/4828 |
| | | | | 257/676 |
| 6,208,021 | B1 * | 3/2001 | Ohuchi | H01L 24/13 |
| | | | | 257/737 |
| 6,271,551 | B1 * | 8/2001 | Schmitz | H10D 30/021 |
| | | | | 257/E21.409 |
| 6,414,385 | B1 * | 7/2002 | Huang | H01L 23/4334 |
| | | | | 257/784 |
| 6,504,224 | B1 * | 1/2003 | Ahn | H01L 21/76886 |
| | | | | 257/E21.585 |
| 6,559,525 | B2 * | 5/2003 | Huang | H01L 23/4334 |
| | | | | 257/713 |
| 6,667,546 | B2 * | 12/2003 | Huang | H01L 23/552 |
| | | | | 257/691 |
| 6,879,017 | B2 * | 4/2005 | Ahn | H01L 21/7682 |
| | | | | 257/E21.585 |
| 6,965,157 | B1 * | 11/2005 | Perez | H01L 23/49548 |
| | | | | 257/787 |
| 7,186,664 | B2 * | 3/2007 | Ahn | H01L 21/76886 |
| | | | | 438/770 |
| 7,560,853 | B2 * | 7/2009 | Sano | H03H 9/174 |
| | | | | 310/320 |
| 11,277,114 | B2 * | 3/2022 | Kikuchi | H01L 23/04 |
| 11,463,065 | B2 | 10/2022 | Goto | |
| 11,588,465 | B2 * | 2/2023 | Fukuhara | H03H 9/6406 |

| | | | | |
|---|---|---|---|---|
| 11,658,688 | B2 * | 5/2023 | Abbott | H03H 9/706 |
| | | | | 333/186 |
| 11,940,712 | B2 * | 3/2024 | Li | G01S 7/4817 |
| 11,967,939 | B2 * | 4/2024 | Shin | H03H 9/0561 |
| 2007/0194662 | A1 * | 8/2007 | Sano | H03H 9/564 |
| | | | | 310/324 |
| 2008/0157311 | A1 * | 7/2008 | Smith | H01L 23/4951 |
| | | | | 257/678 |
| 2012/0212375 | A1 * | 8/2012 | Depree, IV | H01Q 15/0086 |
| | | | | 977/762 |
| 2013/0214640 | A1 * | 8/2013 | Yamazaki | H10N 30/875 |
| | | | | 310/313 B |
| 2013/0278356 | A1 | 10/2013 | Meltaus et al. | |
| 2017/0250669 | A1 * | 8/2017 | Kuroyanagi | H03H 9/02574 |
| 2019/0036510 | A1 * | 1/2019 | Kikuchi | H03H 9/0547 |
| 2019/0181828 | A1 * | 6/2019 | Iwamoto | H03H 9/02897 |
| 2020/0358464 | A1 * | 11/2020 | Abbott | H03H 9/6406 |
| 2020/0412329 | A1 | 12/2020 | Turner et al. | |
| 2021/0013868 | A1 | 1/2021 | Plesski et al. | |
| 2021/0083652 | A1 | 3/2021 | Yantchev | |
| 2021/0119650 | A1 * | 4/2021 | Abbott | H03H 9/725 |
| 2021/0159877 | A1 * | 5/2021 | Fukuhara | H03H 9/02574 |
| 2021/0167752 | A1 | 6/2021 | Caron et al. | |
| 2021/0344321 | A1 * | 11/2021 | Shin | H03H 9/13 |
| 2022/0149809 | A1 | 5/2022 | Dyer et al. | |
| 2022/0158610 | A1 * | 5/2022 | Goto | H03H 9/08 |
| 2022/0158612 | A1 * | 5/2022 | Goto | H03H 9/0561 |
| 2022/0216844 | A1 * | 7/2022 | Yamane | H03H 9/564 |
| 2022/0329227 | A1 * | 10/2022 | Goto | H03H 9/0547 |
| 2023/0111849 | A1 * | 4/2023 | Maki | H03H 3/08 |
| | | | | 333/193 |
| 2023/0120844 | A1 * | 4/2023 | Goto | H03H 9/02102 |
| | | | | 333/191 |
| 2023/0127479 | A1 | 4/2023 | Nagatomo | |
| 2023/0246631 | A1 * | 8/2023 | Dyer | H03H 9/133 |
| | | | | 333/187 |
| 2023/0327636 | A1 * | 10/2023 | Ouchi | H03H 9/02157 |
| | | | | 310/365 |
| 2023/0336146 | A1 * | 10/2023 | Feld | H03H 9/02834 |
| 2023/0336147 | A1 * | 10/2023 | Feld | H03H 9/02102 |
| 2024/0356516 | A1 * | 10/2024 | Caron | H03H 9/58 |
| 2025/0239985 | A1 * | 7/2025 | Hill | H03H 9/173 |
| 2025/0239986 | A1 * | 7/2025 | Hill | H03H 9/02157 |
| 2025/0260380 | A1 * | 8/2025 | Cao | H03H 9/587 |

FOREIGN PATENT DOCUMENTS

| | | | | | |
|---|---|---|---|---|---|
| JP | 2013090273 | A * | 5/2013 | | H03H 9/25 |
| KR | 20220044383 | A * | 4/2022 | | H03H 9/171 |

OTHER PUBLICATIONS

Plessky et al., "Laterally excited bulk wave resonators (XBARs) based on thin Lithium Niobate platelet for 5GHz and 13 GHz filters", IEEE International Microwave Symposium, pp. 512-515, 2019.

* cited by examiner pm
110
88
66   ↑ HIGHER
44   | DISPLACEMENT
22
0 pm
17
13.6
10.2  ↑ HIGHER
6.8   | DISPLACEMENT
3.4
0.0

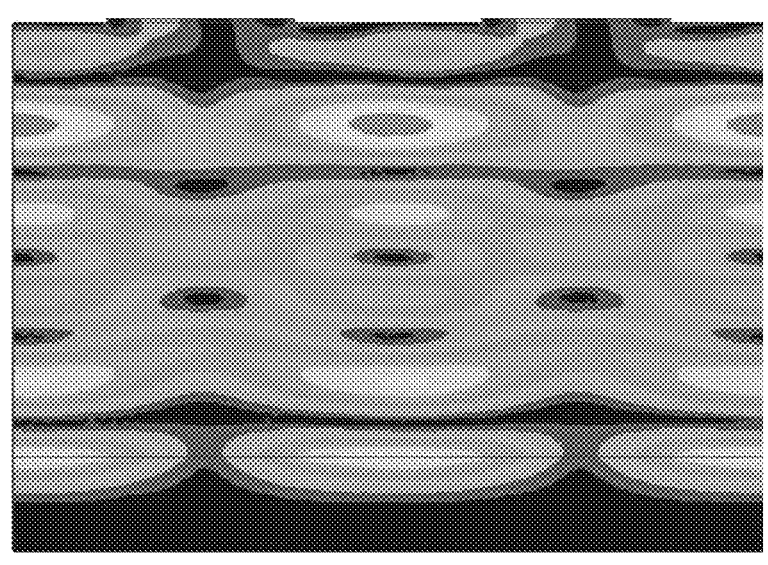
FIG.6B
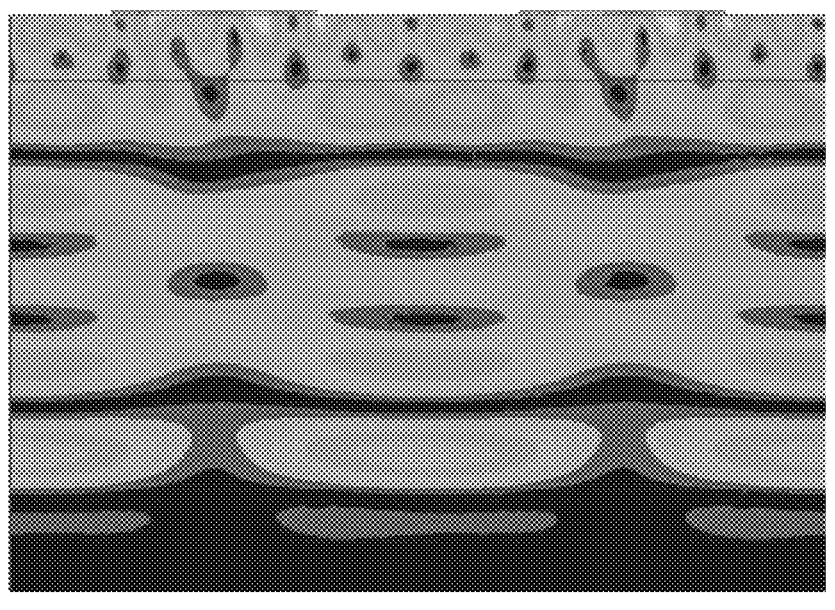
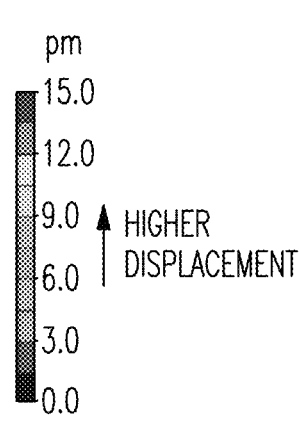
FIG.6C

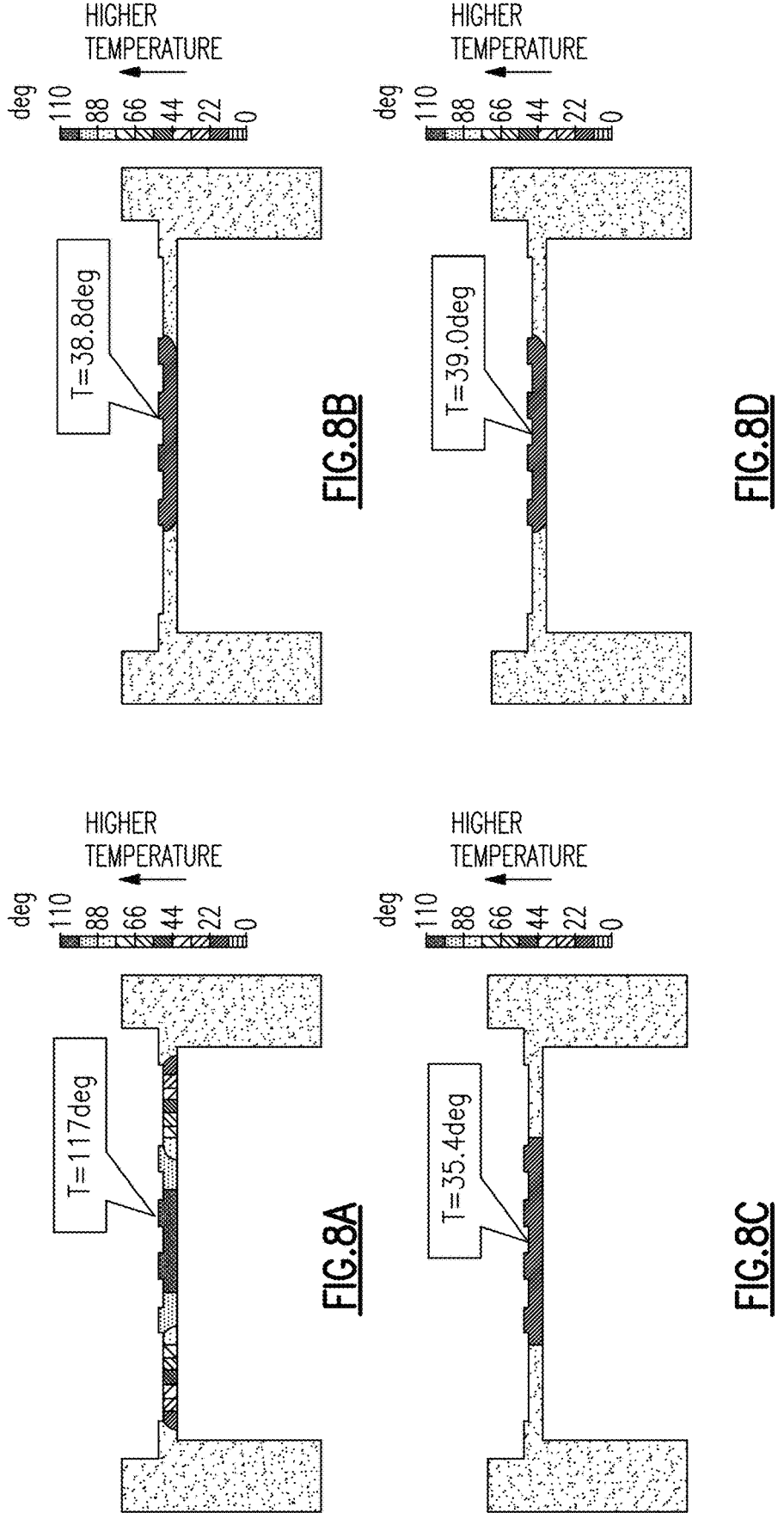

300

310

320

330
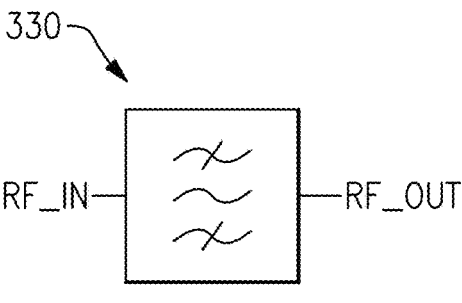
RF_IN —— RF_OUT
FIG.14A
332
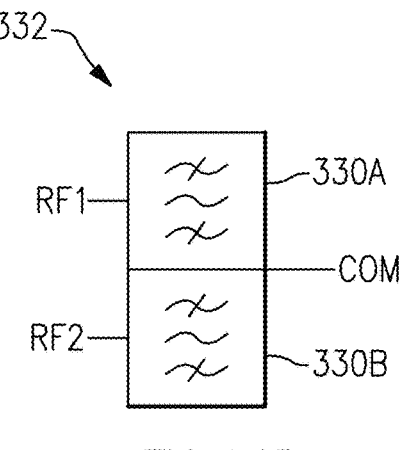
RF1 —— 330A
—— COM
RF2 —— 330B
FIG.14B
334
RF1 —— 330A
⋮
—— COM
RFN —— 330N
FIG.14C

HEAT DISSIPATION STRUCTURE FOR LATERALLY EXCITED BULK ACOUSTIC WAVE DEVICE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application claims the benefit of priority of U.S. Provisional Application No. 63/256,338, filed Oct. 15, 2021, titled "ACOUSTIC WAVE DEVICE," the disclosures of which is hereby incorporated by reference in its entirety and for all purposes.

BACKGROUND

Technical Field

Embodiments of the invention relate to acoustic wave devices.

Description of the Related Technology

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and solidly mounted resonators (SMRs). Certain acoustic resonators can include features of SAW resonators and features of BAW resonators.

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer. As another example, four acoustic wave filters can be arranged as a quadplexer.

SUMMARY

The innovations described in the claims each have several aspects, no single one of which is solely responsible for its desirable attributes. Without limiting the scope of the claims, some prominent features of this disclosure will now be briefly described.

In one aspect, an acoustic wave device is disclosed. The acoustic wave device can include a membrane structure that has a piezoelectric layer, an interdigital transducer electrode arranged on the piezoelectric layer, and a thermally conductive layer arranged at least partially in contact with the piezoelectric layer, and a support substrate that is connected to the membrane structure and configured such that a cavity is provided next to the membrane structure.

In one embodiment, the thermally conductive layer covers the interdigital transducer electrode at least partially. The interdigital transducer electrode can be sandwiched between the thermally conductive layer and the piezoelectric layer.

In one embodiment, the thermally conductive layer is arranged at a first side of the piezoelectric layer opposite to a second side on which the interdigital transducer electrode is arranged on the piezoelectric layer. The thermally conductive layer can be arranged between the piezoelectric layer and the support substrate.

In one embodiment, the thermally conductive layer includes a metal or a semiconductor with high thermal conductivity.

In one embodiment, the thermally conductive layer has a thermal conductivity of 100 W/(m*K) or more.

In one embodiment, the thermally conductive layer includes at least one of aluminum, molybdenum, tungsten, ruthenium, aluminum silicide, aluminum nitride, silicon, diamond-like carbon, or silicon nitride.

In one embodiment, the interdigital transducer electrode has a duty factor of 0.5 or lower.

In one embodiment, the thermally conductive layer has a thickness in a range from 30 nanometers to 300 nanometers.

In one embodiment, the acoustic wave device is a laterally excited bulk acoustic wave resonator.

In one embodiment, the acoustic wave device is configured as an A1 mode laterally excited bulk acoustic wave resonator. The piezoelectric layer can include lithium niobate. The piezoelectric layer can include a lithium niobate crystal cut with a surface normal orientation of $(\alpha, \beta, \gamma)$, with $\alpha$ between $-10°$ and $+10°$, $\beta$ between $-10°$ and $+10°$, and $\gamma$ between $80°$ and $100°$ in Euler angles. The piezoelectric layer can include a lithium niobate crystal cut with a surface normal orientation of $(\alpha, \beta, \gamma)=(0°, 0°, 90°)$ in Euler angles.

In one aspect, a radio frequency module is disclosed. The radio frequency module can include an acoustic wave device that has a membrane structure and a support substrate. The membrane structure includes a piezoelectric layer, an interdigital transducer electrode that is arranged on the piezoelectric layer, and a thermally conductive layer that is arranged at least partially in contact with the piezoelectric layer. The support substrate is connected to the membrane structure and configured such that a cavity is provided next to the membrane structure. The radio frequency module can include a radio frequency circuit element that is coupled to the acoustic wave device. The acoustic wave device and the radio frequency circuit element are enclosed within a common package.

In one embodiment, the radio frequency circuit element is a radio frequency amplifier arranged to amplify a radio frequency signal.

In one embodiment, the radio frequency circuit element is a switch configured to selectively couple the acoustic wave device to an antenna port of the radio frequency module.

In one aspect, a wireless communication device is disclosed. The wireless communication device can include an acoustic wave device that has a membrane structure and a support substrate. The membrane structure includes a piezoelectric layer, an interdigital transducer electrode that is arranged on the piezoelectric layer, a thermally conductive layer that is arranged at least partially in contact with the piezoelectric layer. The support substrate is connected to the membrane structure and configured such that a cavity is provided next to the membrane structure. The wireless communication device can include an antenna operatively that is coupled to the acoustic wave device, a radio frequency amplifier that is operatively coupled to the acoustic wave device and configured to amplify a radio frequency signal, and a transceiver that is in communication with the radio frequency amplifier.

In one embodiment, the wireless communication device further includes a baseband processor in communication with the transceiver.

In one aspect, an acoustic wave device is disclosed. The acoustic wave device can include a piezoelectric layer, an interdigital transducer electrode on a first side of the piezoelectric layer, an air cavity on a second side of the piezoelectric layer that is opposite to the first side of the piezoelectric layer, and a thermally conductive layer. The acoustic wave device is configured to laterally excite a bulk acoustic wave. The thermally conductive layer is configured to dissipate heat associated with exciting the laterally excited bulk acoustic wave.

In one embodiment, the thermally conductive layer is in physical contact with the piezoelectric layer.

In one embodiment, the thermally conductive layer has a thermal conductivity of at least 100 W/(K*m).

In one embodiment, the thermally conductive layer has a thermal conductivity in a range from 100 W/(K*m) to 400 W/(K*m).

In one embodiment, the thermally conductive layer is electrically conductive and on the second side of the piezoelectric layer.

In one embodiment, the thermally conductive layer includes at least one of semiconductor or non-electrically conductive material.

In one embodiment, the piezoelectric layer is a lithium based piezoelectric layer.

In one embodiment, the piezoelectric layer includes lithium niobate.

In one embodiment, the bulk acoustic wave has a resonant frequency that is at least 3 gigahertz. The resonant frequency can be within Frequency Range 1. The resonant frequency can be at least 4 gigahertz.

In one embodiment, the thermally conductive layer has a thickness in a range from 30 nanometers to 300 nanometers.

In one embodiment, the acoustic wave device further includes a silicon substrate under the air cavity.

In one embodiment, the interdigital transducer electrode has a duty factor of 0.4 or less.

In one aspect, an acoustic wave filter for radio frequency filtering is disclosed. The acoustic wave filter can include an acoustic wave resonator that has a piezoelectric layer, an interdigital transducer electrode on a first side of the piezoelectric layer, an air cavity on a second side of the piezoelectric layer that is opposite to the first side of the piezoelectric layer, and a thermally conductive layer that is configured to dissipate heat associated with the acoustic wave resonator generating a laterally excited bulk acoustic wave. The acoustic wave filter can include a plurality of additional acoustic wave resonators. The acoustic wave resonator and the plurality of additional acoustic wave resonators are together configured to filter a radio frequency signal.

In one aspect, a laterally excited bulk acoustic wave device is disclosed. The laterally excited bulk acoustic wave device can include a support substrate, a piezoelectric layer over the support substrate, an interdigital transducer electrode over the piezoelectric layer, an air cavity at least partially between the piezoelectric layer and the support substrate, and a thermally conductive layer in thermal communication with the piezoelectric layer. The thermally conductive layer has a thermal conductivity greater than the piezoelectric layer. The thermally conductive layer is disposed such that the interdigital transducer electrode is positioned closer to the thermally conductive layer than to the support substrate. The acoustic wave device is configured to laterally excite a bulk acoustic wave.

In one embodiment, the thermally conductive layer has a thickness in a range from 30 nanometers to 300 nanometers.

In one embodiment, the thermally conductive layer is positioned at least partially between the piezoelectric layer and the support substrate.

In one embodiment, the thermally conductive layer is disposed over the interdigital transducer electrode.

In one embodiment, the interdigital transducer electrode has a duty factor of 0.4 or less.

The present disclosure relates to U.S. patent application Ser. No. 18/046,388, titled "LATERALLY EXCITED BULK ACOUSTIC WAVE DEVICE WITH THERMALLY CONDUCTIVE LAYER," filed on even date herewith, the entire disclosure of which are hereby incorporated by reference herein.

BRIEF DESCRIPTION OF THE DRAWINGS

Embodiments of this disclosure will now be described, by way of non-limiting example, with reference to the accompanying drawings.

FIG. 6B illustrates displacement at a resonant frequency for the laterally excited bulk acoustic wave device of FIG. 5.

FIG. 6C illustrates displacement at an anti-resonant frequency for the laterally excited bulk acoustic wave device of FIG. 5.

FIG. 8A illustrates heat dissipation by the acoustic wave device of FIG. 7A.

FIG. 8B illustrates heat dissipation by the acoustic wave device of FIG. 7B.

FIG. 8C illustrates heat dissipation by the acoustic wave device of FIG. 7C.

FIG. 8D illustrates heat dissipation by the acoustic wave device of FIG. 7D.

FIG. 14A is a schematic diagram of an acoustic wave filter.

FIG. 14B is a schematic diagram of a duplexer.

FIG. 14C is a schematic diagram of a multiplexer with hard multiplexing.

DETAILED DESCRIPTION OF CERTAIN EMBODIMENTS

Figure 1B:
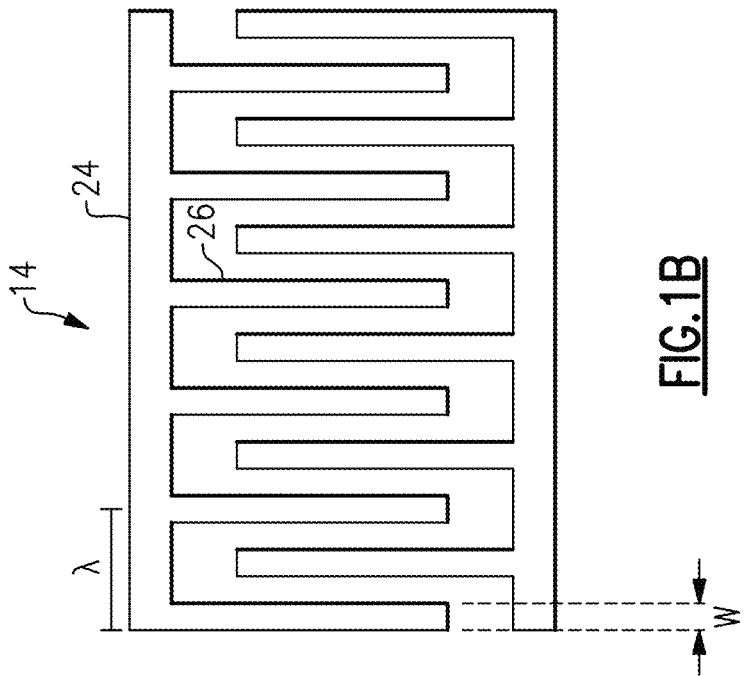
FIG. 1B is a schematic top plan view of an interdigital transducer (IDT) electrode of the laterally excited bulk acoustic wave device of FIG. 1A.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Laterally excited bulk acoustic wave resonators can be included in acoustic wave filters for high frequency bands, such as frequency bands above 3 Gigahertz (GHz) and/or frequency bands above 5 GHz. Such frequency bands can include a fifth generation (5G) New Radio (NR) operating band. Certain laterally excited bulk acoustic wave resonators can include an interdigital transducer (IDT) electrode on a relatively thin piezoelectric layer. A bulk acoustic wave (BAW) mode excited by the IDT electrode is not strongly affected by the pitch of IDT electrode in certain applications. Accordingly, such a resonator can have a higher operating frequency than certain conventional surface acoustic wave (SAW) resonators. Certain laterally excited bulk acoustic wave resonators can be free standing. However, heat dissipation can be undesirable in such free standing laterally excited bulk acoustic wave resonators. Power durability and/or mechanical ruggedness of such laterally excited bulk acoustic wave resonators can be a technical concern. Free standing laterally excited bulk acoustic wave resonators with lithium niobate or lithium tantalate piezoelectric layers can encounter problems related to power durability in transmit filter applications.

Heat dissipation and mechanical ruggedness can be improved by bonding a piezoelectric layer to a support substrate with a relatively high thermal conductivity. By bonding the piezoelectric layer directly to the support substrate, resonance characteristics can be degraded by leakage into support substrate.

A solid acoustic mirror can be positioned between a piezoelectric layer and a support substrate to reduce leakage into support substrate. An IDT electrode can be positioned on the piezoelectric layer. The support substrate can have a relatively high thermal conductivity. For example, the support substrate can be a silicon support substrate. The solid acoustic mirror, which can be an acoustic Bragg reflector, can reduce and/or eliminate leakage into the support substrate. With such a structure, acoustic energy can be confined over the solid acoustic mirror effectively and heat can flow though the support substrate with the relatively high thermal conductivity. A relatively high frequency resonance can be achieved with desirable power durability.

Though the acoustic Bragg reflector can provide sufficient power durability and thermal dissipation, it may be more expensive to implement the acoustic Bragg reflector in an acoustic wave device than an air cavity. Embodiments disclosed herein relate to a laterally excited bulk acoustic wave resonator with an air cavity and that includes a thermally conductive layer. The laterally excited bulk acoustic wave resonator can include a support substrate, a piezoelectric layer over the support substrate, an interdigital transducer electrode over the piezoelectric layer, and a cavity (e.g., an air cavity) between the piezoelectric layer and at least a portion of the support substrate. A thermally conductive layer can be disposed over the piezoelectric layer or between the piezoelectric layer and the support substrate and/or the air cavity. The thermally conductive layer can be in physical contact with the piezoelectric layer. The laterally excited bulk acoustic wave resonator is configured to laterally excite a bulk acoustic wave, and the thermally conductive layer is configured to dissipate heat associated with exciting the laterally excited bulk acoustic wave. The laterally excited bulk acoustic wave resonators disclosed herein can enable sufficient power durability and thermal dissipation for high performance applications, while being less expensive than implementing certain acoustic Bragg reflectors.

A laterally excited bulk acoustic wave device including any suitable combination of features disclosed herein can be included in a filter arranged to filter a radio frequency signal in a fifth generation 5G NR operating band within Frequency Range 1 (FR1). A filter arranged to filter a radio frequency signal in a 5G NR operating band can include one or more laterally excited bulk acoustic wave device disclosed herein. FR1 can be from 410 MHz to 7.125 GHz, for example, as specified in a current 5G NR specification.

A laterally excited bulk acoustic wave device disclosed herein can be included in a filter arranged to filter a radio frequency signal having a frequency above FR1. For example, a laterally excited bulk acoustic wave device can be included in a filter arranged to filter radio frequency signals in a range from 10 GHz to 25 GHz. In applications where such high frequency signals are being transmitted, higher transmit powers can be used to account for higher loss in communication channels at higher frequencies. Accordingly, thermal dissipation at high frequencies of laterally excited bulk acoustic wave devices disclosed herein can be desirable.

In certain 5G applications, the thermal dissipation of the acoustic wave disclosed herein can be advantageous. For example, such thermal dissipation can be desirable in 5G applications with a higher time-division duplexing (TDD) duty cycle compared to fourth generation (4G) Long Term Evolution (LTE) applications. As another example, there can be more ganging of filters and carrier aggregation in 5G applications than 4G LTE applications. Accordingly, signals can have higher power to account for losses associated with such ganging of filters and/or carrier aggregation. Thermal dissipation of laterally excited bulk acoustic wave devices disclosed can be implemented in these example applications to improve performance of filters.

One or more laterally excited bulk acoustic wave devices in accordance with any suitable principles and advantages disclosed herein can be included in a filter (e.g., an acoustic wave filter) arranged to filter a radio frequency signal in a 4G LTE operating band and/or in a filter having a passband that includes a 4G LTE operating band and a 5G NR operating band.

Figure 1A:
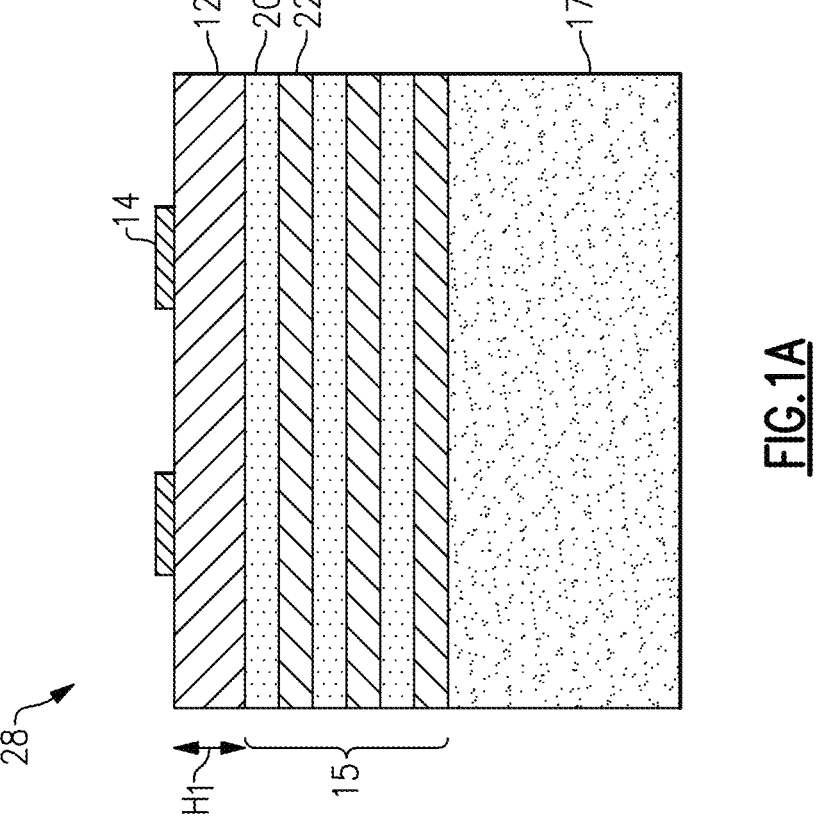
FIG. 1A is a schematic cross sectional side view of a laterally excited bulk acoustic wave device.

FIG. 1A is a cross sectional diagram of a laterally excited bulk acoustic wave device 28 with a solid acoustic mirror 15 according to an embodiment. The laterally excited bulk acoustic wave device 28 can be a laterally excited bulk acoustic wave resonator included in a filter. The laterally excited bulk acoustic wave device 28 can be any other suitable laterally excited bulk acoustic wave device, such as a device in a delay line. The laterally excited bulk acoustic wave device 28 can be implemented in relatively high frequency acoustic wave filters. Such acoustic wave filters can filter radio frequency signals having frequencies above 3 GHz and/over above 5 GHz. As illustrated, the laterally excited bulk acoustic wave device 28 includes a support substrate 17, a solid acoustic mirror 15 on the support substrate 17, a piezoelectric layer 12 on the solid acoustic mirror 15, and an IDT electrode 14 on the piezoelectric layer 12. The IDT electrode 14 is arranged to laterally excite a bulk acoustic wave. The substrate 17 can function like a heat sink. The substrate 17 can provide thermal dissipation and improve power durability of the laterally excited bulk acoustic wave device 28.

The piezoelectric layer 12 can be a lithium based piezoelectric layer. For example, the piezoelectric layer 12 can be a lithium niobate layer. As another example, the piezoelectric layer 12 can be a lithium tantalate layer. In certain applications, the piezoelectric layer 12 can be an aluminum nitride layer. The piezoelectric layer 12 can be any other suitable piezoelectric layer.

In certain surface acoustic wave resonators, there can be horizontal acoustic wave propagation. In such surface acoustic wave resonators, IDT electrode pitch can set the resonant frequency. Limitations of photolithography can set a lower bound on IDT electrode pitch and, consequently, resonant frequency of certain surface acoustic wave resonators.

The laterally excited bulk acoustic wave device 28 can generate a Lamb wave that is laterally excited. A resonant frequency of the laterally excited bulk acoustic wave device 28 can depend on a thickness H1 of the piezoelectric layer 12. The thickness H1 of the piezoelectric layer 12 can be a dominant factor in determining the resonant frequency for the laterally excited bulk acoustic wave device 28. The pitch of the IDT electrode 14 can be a second order factor in determining resonant frequency of the laterally excited bulk acoustic wave device 28. A thickness of a low impedance layer, such as a silicon dioxide layer, directly under the piezoelectric layer 12 can have a secondary impact on the resonant frequency of the laterally excited bulk acoustic wave device 28. The thickness of such a low impedance layer can be sufficient to adjust resonant frequency for a shunt resonator and a series resonator of a filter.

A combination of the thickness H1 of the piezoelectric layer 12 and acoustic velocity in the piezoelectric layer 12 can determine the approximate resonant frequency of the laterally excited bulk acoustic wave device 28. The resonant frequency can be increased by making the piezoelectric layer 12 thinner and/or by using a piezoelectric layer 12 with a higher acoustic velocity.

The piezoelectric layer 12 can be manufactured with a thickness H1 that is 0.2 micrometers or higher from the fabrication point of view. The piezoelectric layer 12 can have a thickness in a range from 0.2 micrometers to 0.4 micrometers in certain applications. The piezoelectric layer can have a thickness in a range from 0.2 micrometers to 0.3 micrometers. In certain applications, the piezoelectric layer 12 can have a thickness H1>0.04L from the electrical performance (K2) point of view, in which L is IDT electrode pitch.

The laterally excited bulk acoustic wave device 28 with a 0.2 micrometer thick aluminum nitride piezoelectric layer 12 can have a resonant frequency of approximately 25 GHz. The laterally excited bulk acoustic wave device 28 with a 0.2 micrometer thick lithium niobate piezoelectric layer 12 can have a resonant frequency of approximately 10 GHz. The laterally excited bulk acoustic wave device 28 with a 0.4 micrometer thick lithium niobate piezoelectric layer 12 can have a resonant frequency of approximately 5 GHz. Based on the piezoelectric materials and thickness of the piezoelectric layer, the resonant frequency of the laterally excited bulk acoustic wave device 28 can be designed for filtering an RF signal having a particular frequency.

Odd harmonics for a laterally excited bulk acoustic wave resonator can have a k2 that is sufficiently large for a ladder filter in certain applications. Such odd harmonics (e.g., a 3rd harmonic) can have a k2 that is proportional to fundamental mode k2. A laterally excited bulk acoustic wave resonator using an odd harmonic can have a lithium niobate piezoelectric layer. The electromechanical coupling factor k2 (or, more formally, $k^2$), is usually defined by:

$$k^2 = \frac{\pi}{2} \frac{f_s}{f_p} \tan\left(\frac{\pi}{2} \frac{\Delta f}{f_p}\right),$$

with fs and fp the frequencies of the resonance and anti-resonance, respectively, and Δf=fs−fp.

Filters that include one or more laterally excited bulk acoustic wave devices 28 can filter radio frequency signals up to about 10 GHz with a relatively wide bandwidth. Filters that include one or more laterally excited bulk acoustic wave devices 28 can filter radio frequency signals having a frequency in a range from 10 GHz to 25 GHz. In some instances, a filter that include one or more laterally excited bulk acoustic wave devices 28 can filter an RF signal having a frequency in a range from 3 GHz to 5 GHz, a range from 4.5 GHz to 10 GHz, a range from 5 GHz to 10 GHz, or a range from 10 GHz to 25 GHz.

In the laterally excited bulk acoustic wave device 28, the IDT electrode 14 is over the piezoelectric layer 12. As illustrated, the IDT electrode 14 has a first side in physical contact with the piezoelectric layer 12 and a second side in physical contact with a layer of the solid acoustic mirror 16. The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some applications.

The solid acoustic mirror 15 includes alternating low impedance layers 20 and high impedance layers 22. Accordingly, the solid acoustic mirror 15 is an acoustic Bragg reflector. The low impedance layers 20 can be any suitable low impedance material such as silicon dioxide (SiO2) or the like. The high impedance layers 22 can be any suitable high impedance material such as platinum (Pt), tungsten (W), iridium (Ir), aluminum nitride (AlN), molybdenum (Mo), or the like.

As illustrated, the layer of the solid acoustic mirror 15 closest to the piezoelectric layer 12 is a low impedance layer 20. Having a low impedance layer 20 closest to the piezoelectric layer 12 can increase an electromechanical coupling coefficient (k2) of the laterally excited bulk acoustic wave device 28 and/or bring a temperature coefficient of frequency (TCF) of the laterally excited bulk acoustic wave device 28 closer to 0 in certain instances.

As illustrated, the layer of the solid acoustic mirror 15 closest to the substrate 17 is a high impedance layer 22. Having a high impedance layer 22 closest to the substrate 17 can increase reflection of the layer of the solid acoustic mirror 15 closest to the substrate 17. Alternatively, a solid acoustic mirror (not illustrated) with a low impedance layer 20 closest to the substrate 17 can have a higher adhesion with the substrate 17. For example, when the substrate 17 is a silicon substrate, the substrate should have a higher adhesion with a solid acoustic mirror with a silicon dioxide low impedance layer 20 that is closest to the support substrate (not illustrated) relative to the having a platinum high impedance layer 22 closest to the substrate 17. A low impedance layer of an acoustic mirror in contact with the substrate 17 can have a reduced thickness compared to other low impedance layers of the acoustic mirror in certain applications.

The solid acoustic mirror 15 can confine acoustic energy. The solid acoustic mirror 15 can confine acoustic energy such that the support substrate 17 is free from acoustic energy during operation of the laterally excited bulk acoustic wave device 28. At least one of the low impedance layers 20 and/or at least one of the high impedance layers 22 can be free from acoustic energy during operation of the laterally excited bulk acoustic wave device 28.

The support substrate 17 can dissipate heat associated with generating a laterally excited bulk acoustic wave. The support substrate 17 can be any suitable support substrate. The support substrate 17 can have a relatively high thermal conductivity to dissipate heat associated with operation of the laterally excited bulk acoustic wave device 28. The support substrate 17 can be a silicon substrate. The support substrate 17 being a silicon substrate can be advantageous for processing during manufacture of the laterally excited bulk acoustic wave device 28 and provide desirable thermal conductivity. Silicon is also a relatively inexpensive material. The support substrate 17 can be an aluminum nitride substrate. In some other applications, the support substrate 17 can be a quartz substrate, a ceramic substrate, a glass substrate, a spinel substrate, a magnesium oxide spinel substrate, a sapphire substrate, a diamond substrate, a diamond like carbon substrate, a silicon carbide substrate, a silicon nitride substrate, or the like.

FIG. 1B illustrates the IDT electrode 14 of the laterally excited bulk acoustic wave device 28 of FIG. 1A in a plan view. Only the IDT electrode 14 of the laterally excited bulk acoustic wave device 28 is shown in FIG. 1B. The IDT electrode 14 includes a bus bar 24 and IDT fingers 26 extending from the bus bar 24. The IDT fingers 26 have a pitch of λ, and a width of W. As discussed above, the pitch λ, can have less impact than the thickness of the piezoelectric layer 12 in the laterally excited bulk acoustic wave device 28. The laterally excited bulk acoustic wave device 28 can include any suitable number of IDT fingers 26.

Figure 2:
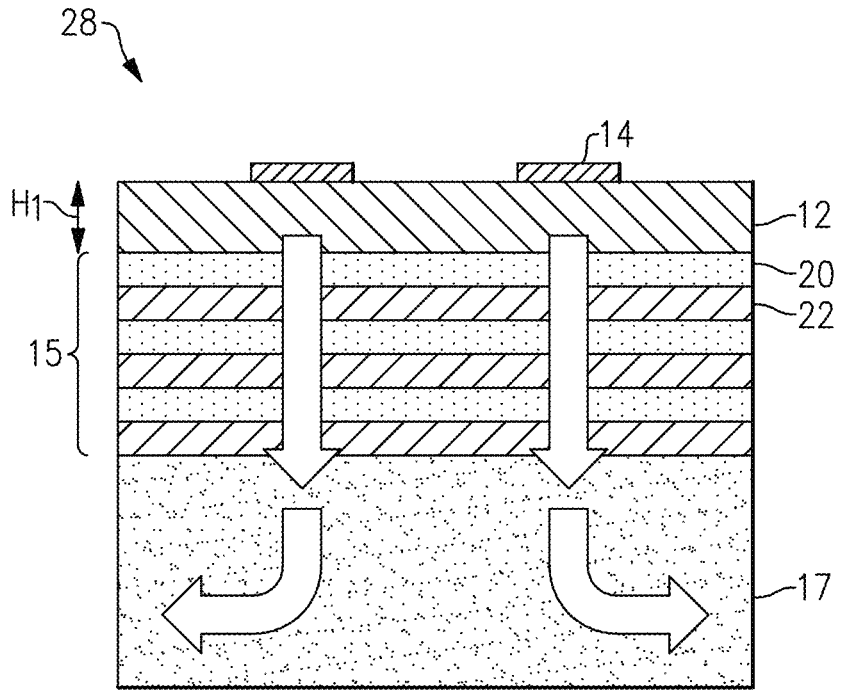
FIG. 2 is a schematic cross sectional side view showing heat flow in the laterally excited bulk acoustic wave device of FIG. 1A.

FIG. 2 is a cross sectional view showing heat flow in the laterally excited bulk acoustic wave device 28 of FIG. 1A. During operation, heat can be generated by the IDT electrode 14. This heat can flow through the piezoelectric layer 12 and the solid acoustic mirror 15 to the substrate 17. Accordingly, the solid acoustic mirror 15 can provide a heat flow path from the piezoelectric layer 12 to the substrate 17. The substrate 17 can have a relatively high thermal conductivity and provide heat dissipation. The substrate 17 can increase mechanical durability.

Figure 3:
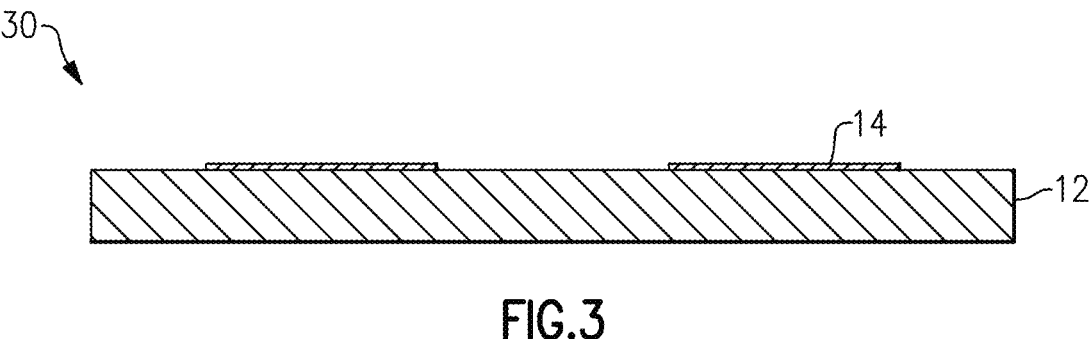
FIG. 3 is a schematic cross sectional side view of a baseline laterally excited bulk acoustic wave device.

FIG. 3 is a cross sectional diagram of a baseline laterally excited bulk acoustic wave device 30. As illustrated, the baseline laterally excited bulk acoustic wave device 30 includes a piezoelectric layer 12 and an IDT electrode 14 on the piezoelectric layer 12. The laterally excited bulk acoustic wave device 30 can be a free standing device supported over a support substrate. There can be an air cavity positioned between the piezoelectric layer 12 and the support substrate.

Figure 4A:
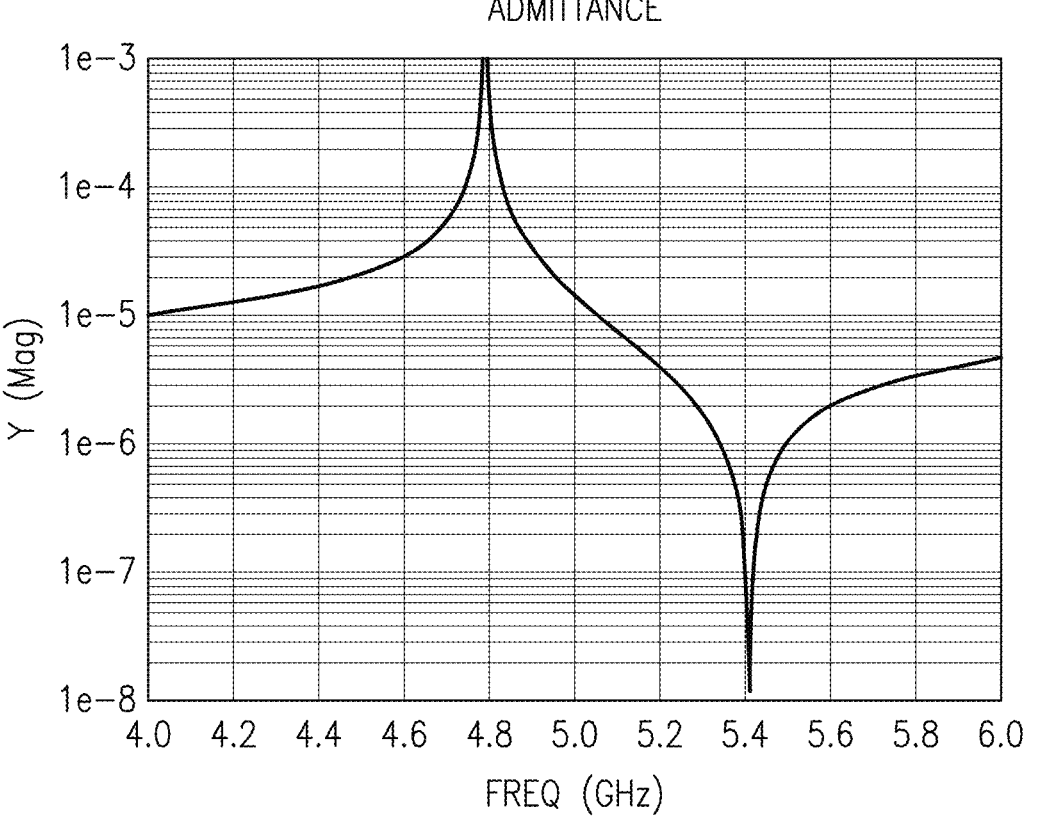
FIG. 4A is graph showing admittance of the baseline laterally excited bulk acoustic wave device of FIG. 3.

FIG. 4A is graph of admittance of the baseline laterally excited bulk acoustic wave device 30 of FIG. 3. This graph shows a relatively clean frequency response with a resonant frequency at around 4.8 GHz and an anti-resonant frequency around 5.4 GHz.

Figure 4B:
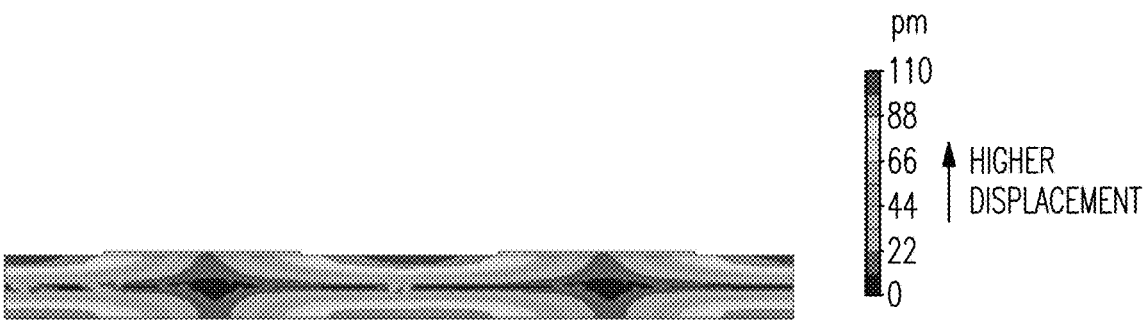
FIG. 4B illustrates displacement at a resonant frequency for the baseline laterally excited bulk acoustic wave device of FIG. 3.

FIG. 4B illustrates displacement at a resonant frequency for the baseline laterally excited bulk acoustic wave device 30 of FIG. 3. FIG. 4B indicates displacement in the piezoelectric layer 12 at the resonant frequency.

Figure 4C:
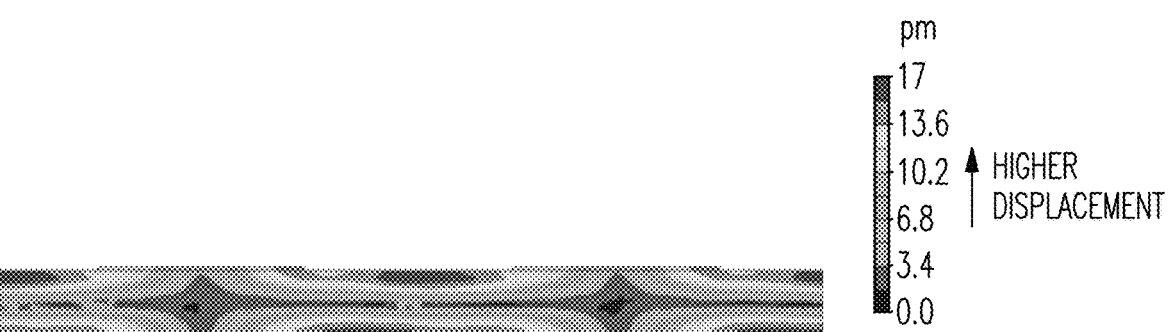
FIG. 4C illustrates displacement at an anti-resonant frequency for the baseline laterally excited bulk acoustic wave device of FIG. 3.

FIG. 4C illustrates displacement at an anti-resonant frequency for the baseline laterally excited bulk acoustic wave device 30 of FIG. 3. FIG. 4C indicates displacement in the piezoelectric layer 12 at the anti-resonant frequency.

Figure 5:
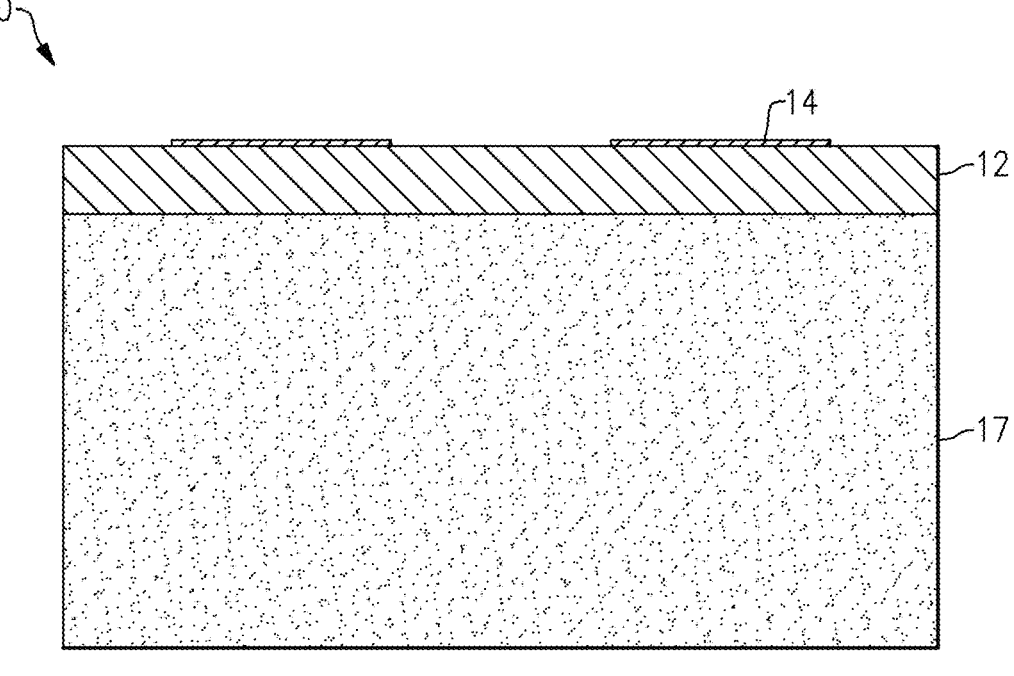
FIG. 5 is a schematic cross sectional side view of a laterally excited bulk acoustic wave device with a support substrate in contact with a piezoelectric layer.

FIG. 5 is a cross sectional diagram of a laterally excited bulk acoustic wave device 50 with a support substrate in contact with a piezoelectric layer. As illustrated, the laterally excited bulk acoustic wave device 50 includes a piezoelectric layer 12, an IDT electrode 14 on a first side of the piezoelectric layer 12, and a support substrate 17 in contact with a second side of the piezoelectric layer 12 that is opposite to the first side. The support substrate 17 can be a silicon substrate. The support substrate 17 can dissipate heat associated with operation of the laterally excited bulk acoustic wave device 50.

Figure 6A:
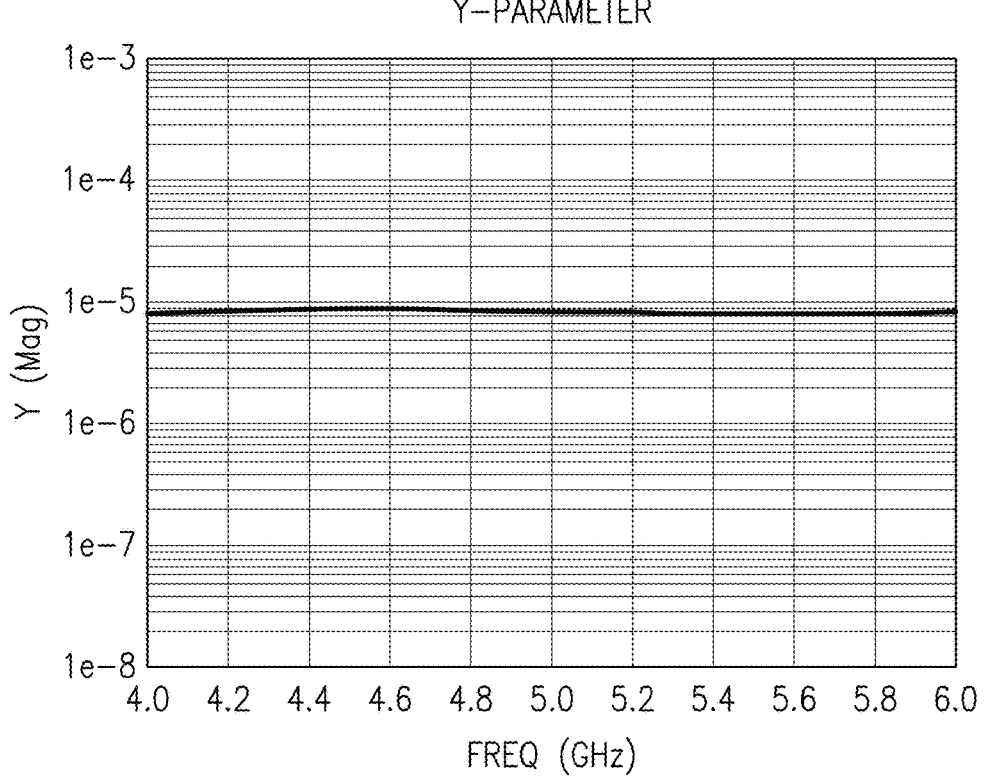
FIG. 6A is graph showing admittance of the laterally excited bulk acoustic wave device of FIG. 5.

FIG. 6A is graph of admittance of the laterally excited bulk acoustic wave device 50 of FIG. 5, in which the support substrate 17 is a silicon substrate. This graph indicates that the laterally excited bulk acoustic wave device 50 produces a low quality factor (Q) that is generally undesirable for an acoustic wave filter.

FIG. 6B illustrates displacement at a resonant frequency for the laterally excited bulk acoustic wave device 50 of FIG. 5, in which the support substrate 17 is a silicon substrate. FIG. 6B indicates acoustic energy leakage into the silicon substrate at the resonant frequency.

FIG. 6C illustrates displacement at an anti-resonant frequency for the laterally excited bulk acoustic wave device 50 of FIG. 5, in which the support substrate 17 is a silicon substrate. FIG. 6B indicates acoustic energy leakage into the silicon substrate at the anti-resonant frequency.

For example, in order to obtain a piezoelectric layer 12 for a laterally excited bulk acoustic wave device 90, a lithium niobate crystal may be cut along a plane with Euler angles of $(\alpha, \beta, \gamma)$, with $\alpha$ between $-10°$ and $10°$, $\beta$ between $-10°$ and $10°$, and $\gamma$ between $80°$ and $100°$. Especially preferred is a lithium niobate crystal cut along a plane with Euler angles of $(\alpha, \beta, \gamma)=(0°, 0°, 90°)$.

Including silicon dioxide between fingers of the IDT electrode can suppress a spurious mode by thicker IDT electrodes. Resonant frequency can be dominated by total thickness of the piezoelectric layer 12 and silicon dioxide. An upper silicon dioxide layer can provide frequency tuning. A trimming range can be sufficient to cover series and parallel arms in a ladder type filter.

As described herein, a laterally excited bulk acoustic wave resonator with an air cavity can enable sufficient power durability. A laterally excited bulk acoustic wave resonator with an air cavity may have a relatively low heat dissipation property. A thermally conductive layer can be provided in a laterally excited bulk acoustic wave resonator to enable improved heat dissipation.

Figures 7A, 7B, 7C, 7D:
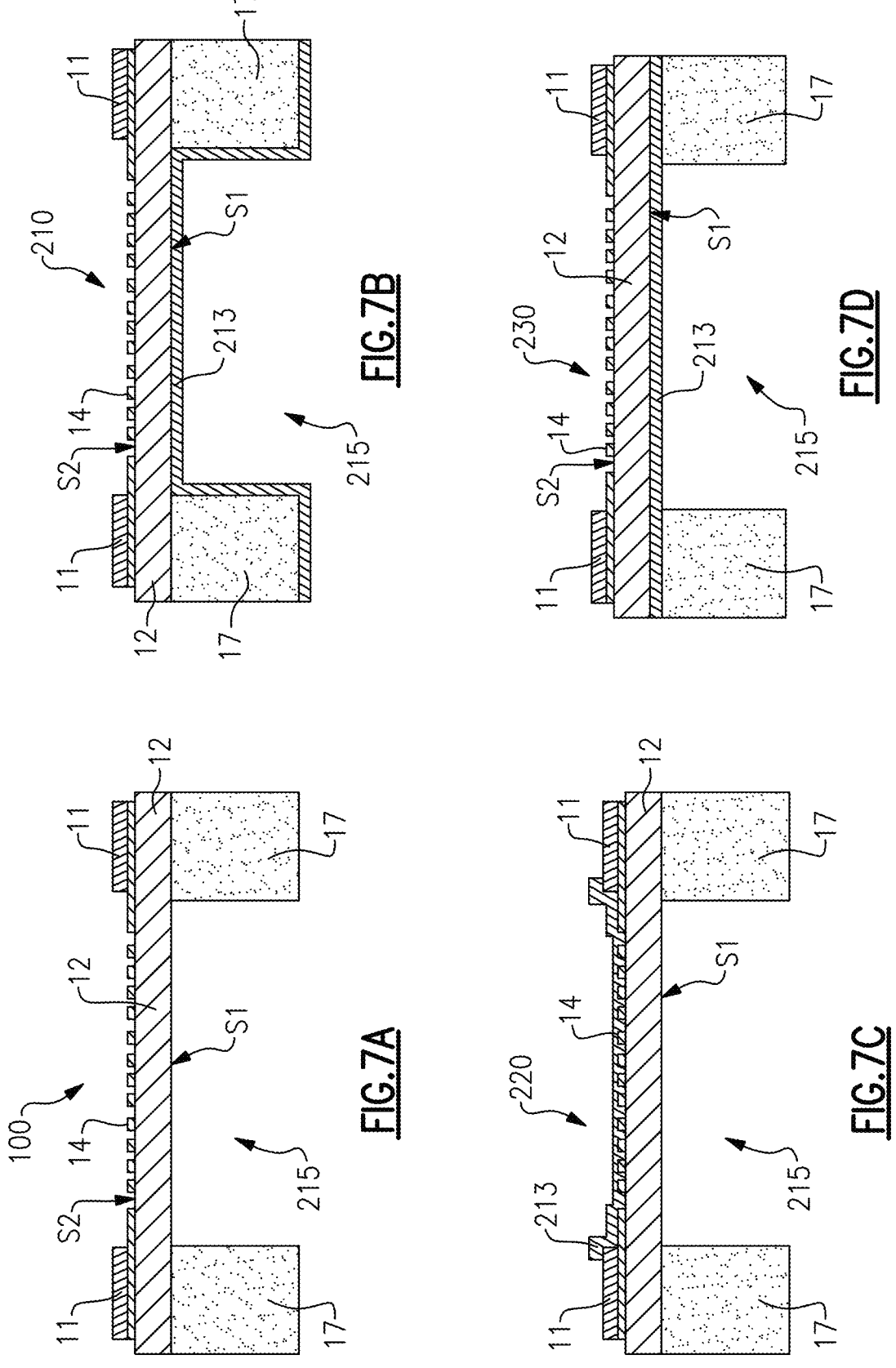
FIG. 7A is a schematic cross sectional side view of a laterally excited bulk acoustic wave device.
FIG. 7B is a schematic cross sectional side view of a laterally excited bulk acoustic wave device according to an embodiment.
FIG. 7C is a schematic cross sectional side view of a laterally excited bulk acoustic wave device according to another embodiment.
FIG. 7D is a schematic cross sectional side view of a laterally excited bulk acoustic wave device according to another embodiment.

FIG. 7A is a cross sectional diagram of a laterally excited bulk acoustic wave device before a design refinement that will be described in the following. Compared to the laterally excited bulk acoustic wave device 50 of FIG. 5, the support substrate 17 is, in the laterally excited bulk acoustic wave device 100 of FIG. 7A, formed such as to leave a substantial part, preferably a majority, of a surface of the piezoelectric layer 12 that the support substrate 17 touches free. This surface of the piezoelectric layer 12 that is touched by the support substrate 17 will, in the following, sometimes be designated as a "lower surface" of the piezoelectric layer 12, or as a "first surface" Si of the piezoelectric layer 12. The term "lower surface" refers to the depiction in the drawings herein only and does not imply that this surface must be oriented downwards. Similarly, the term "first surface" Si does imply neither any hierarchy of importance or of manufacture but is merely a convenient designation. Analogously, the other surface of the piezoelectric layer 12, i.e. the surface on which the IDT electrodes 14 are arranged and which is facing away from the first surface S1, is designated as an "upper surface" of the piezoelectric layer 12, or as a "second surface" S2 of the piezoelectric layer 12.

Thus, in other words, the support substrate 17 does not cover the first surface S1 of the piezoelectric layer 12 completely. In this way, a free space, or a cavity 215, is formed between the piezoelectric layer 12 and parts of the support substrate 17. It is evident that in this way the piezoelectric layer 12 is less restricted and therefore resonance modes may propagate more freely. The support substrate 17 can be formed as a series of columns or pillars and may cover less than 50%, preferably less than 25%, of the first surface S1. The support substrate 17 preferably has a thickness between about 1 micrometer and about 200 micrometers. The piezoelectric layer 12 preferably has a thickness between about 0.2 micrometers and about 1 micrometer. The laterally excited bulk acoustic wave device 100 configured in such a way may be termed a thin-film laterally excited bulk acoustic wave device 100. It is especially well suited for an A1 mode resonance operation and may therefore also be designated as a "piezo thin film A1 mode resonator".

In FIG. 7A, the IDT electrodes 14 are shown in its cross-section in more detail than in the foregoing figures. The voltages can be applied to the two poles via signal lines 11, preferably metallic signal lines, arranged on top of a layer in (and from) which the IDT electrodes 14 are formed. The signal lines 11 preferably have a larger thickness than the IDT electrodes 14 in order to reduce resistive loss. To improve conductivity, the signal lines 11 advantageously comprise, or consist of, aluminum (Al), copper (Cu) or gold (Au). The thickness of the signal lines 11 is preferably between about 0.5 micrometers and about 4 micrometers. The laterally excited bulk acoustic wave device 100 of FIG. 7A is advantageous with respect to its resonance modes but has deficits in terms of heat management: usually, during operation of a laterally excited bulk acoustic wave device 100, for example in a filter device or the like, most of the heat is produced between the IDT electrodes 14. At the same time, it is desired that the area of the piezoelectric layer 12 where the acoustic waves originate, propagate and/or terminate are as far away from the contact points between the support substrate 17 and the piezoelectric layer 12 as possible so that the acoustic waves are affected as little as possible. In order to improve heat removal, some design refinements are proposed and described with respect to FIGS. 7B, 7C, and 7D.

FIG. 7B is a schematic cross sectional view of a laterally excited bulk acoustic wave device 210 according to an embodiment. Unless otherwise noted, the components of FIG. 7B can be the same as or generally similar to the like components disclosed herein. The laterally excited bulk acoustic wave device 210 shown in FIG. 7B differs from the laterally excited bulk acoustic wave device 100 of FIG. 7A only in that the laterally excited bulk acoustic wave device 210 comprises an additional thermal conductive layer 213. The thermally conductive layer 213 is preferably a layer with a higher thermal conductivity than the piezoelectric layer 12 and/or the support substrate 17. In some embodiments, the thermally conductive layer 213 can be in direct contact with at least a portion of the piezoelectric layer. The thermally conductive layer 213 can thermally and/or physically contact the piezoelectric layer 12.

In the embodiment of FIG. 7B, the thermally conductive layer 213 is applied and arranged to the laterally excited bulk acoustic wave device 100 of FIG. 7A from below, i.e. from a side of the laterally excited bulk acoustic wave device 100 on which the support substrate 17 is attached to the piezoelectric layer 12. Specifically, the thermally conductive layer 213 covers the parts of the first surface S1 which are left free by the support substrate 17. Additionally, the thermally conductive layer 213 may also cover one or more surfaces of the support substrate 17 in order to further facilitate heat transport from the piezoelectric layer 12 towards the support substrate 17. In some embodiments, the thermally conductive layer 213 can be conformally disposed on inner surfaces of the cavity 215. In the illustrated embodiment of the laterally excited bulk acoustic wave device 210, the thermally conductive layer 213 can be at least partially disposed between the piezoelectric layer 12 and the support substrate 17. At least a portion between the piezoelectric layer 12 and the support substrate 17 can be free from the thermally conductive layer 213.

As shown in FIG. 7B, the thermally conductive layer 213 may cover vertical surfaces of the support substrate 17, (e.g., surfaces generally perpendicular to the first surface S1 of the piezoelectric layer 12), which are facing inwards (e.g., towards each other and towards the cavity 215). The thermally conductive layer 213 can facilitate heat dissipation in the laterally excited bulk acoustic wave device 210. The thermally conductive layer 213 may be provided by way of chemical vapor deposition, CVD, or the like. The thermally conductive layer 213 can be relatively thin. In some embodiments, the thermally conductive layer 213 can be thinner than the piezoelectric layer 12 and/or the support substrate 17. For example, a thickness of the thermally conductive layer 213 can be in a range between 0.03 μm and 0.3 μm, 0.05 μm and 0.2 μm, or 0.05 μm and 1.05 μm.

The laterally excited bulk acoustic wave device 210 can be considered to comprise, or consist of, two main structures: the support substrate 17 on the one hand, and a membrane structure on the other hand. The membrane structure comprises, or consists of, the piezoelectric layer 12, the IDT electrodes 14, and the thermally conductive layer 213, optionally also the signal lines 11. Thus, the support substrate 17 is connected to the membrane structure in such a way that the free space, or cavity 215, is formed (or: provided, or: maintained) next to the membrane structure, or, expressed differently, it is the shape and arrangement of the support substrate 17 which makes the layered structure of the piezoelectric layer 12, the IDT electrodes 14, and the thermally conductive layer 213, into a membrane in the first place. In some embodiments, the thermally conductive layer 213 can be positioned such that the IDT electrodes 14 is located closer to the thermally conductive layer 213 than to the support substrate 17.

The thermally conductive layer 213 can be formed of any material with a high heat conductivity. In designs such as the one of FIG. 7B where the thermally conductive layer 213 does not touch or directly contact the IDT electrodes 14, the thermally conductive layer 213 may be formed of an electrically conducting material and/or a semiconducting or non-conducting material. In designs where the thermally conductive layer 213 touches or directly contacts the IDT electrodes 14, the thermally conductive layer 213 is formed of a semiconducting or non-conducting material. Suitable materials for the thermally conductive layer 213 in general are, due to their high thermal conductivity: metals (e.g., aluminum (Al), tungsten (W), molybdenum (Mo), ruthenium (Ru), aluminum nitride (AlN), silicon (Si), diamond-like carbon (DLC), silicon nitride (SiN), and/or the like. The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some applications. The support substrate 17 may include, consist of, or consist essentially of silicon (Si), such as crystalline silicon.

The thermally conductive layer 213 preferably has a high thermal conductivity, for example 100 W/(K*m) or more, 130 W/(K*m) or more, 150 W/(K*m) or more, 200 W/(K*m) or more, 400 W/(K*m) or more or even higher thermal conductivities, here always expressed in Watts per Kelvin-meter, either measured with a transient or a steady-state measuring method. It has been found by the inventors that, compared to the low thermal conductivity of most piezoelectric materials, a thermal conductivity of the thermally conductive layer 213 of at least 100 W/(K*M) provides a significant improvement in thermal conductivity and is sufficient in many cases.

FIG. 7C shows an laterally excited bulk acoustic wave device 220 which is a variant of the laterally excited bulk acoustic wave device 210 of FIG. 7B. Unless otherwise noted, the components of FIG. 7C can be the same as or generally similar to the like components disclosed herein. In this variant, the thermally conductive layer 213 is not arranged on the first surface S1 of the piezoelectric layer 12, but instead on the other side of the laterally excited bulk acoustic wave device 220. As illustrated, the thermally conductive layer 213 can cover the IDT electrodes 14, at least a portion of the metal signal lines 11, and at least a portion of the second surface S2 of the piezoelectric layer 12. The signal lines 11 are preferably arranged in line with the columns formed by the support substrate 17, and the thermally conductive layer 213 preferably extends at least over the IDT electrodes 14 (more specifically, the area of highest heat production during operation) on one end and up to (or over a portion of) the metal signal lines 11 on the other end. In this way, heat is horizontally (in the drawings) transported away from the area of heat production towards the areas where the support substrate 17 contacts the piezoelectric layer 12. Thus, heat can be efficiently transported away by the support substrate 17. However, since the thermally conductive layer 213 in this variant touches and surrounds the IDT electrodes 14 as well as the second surface S2 of the piezoelectric layer 12 where the bulk acoustic waves are coupled in, the resonance properties of the piezoelectric layer 12 and the laterally excited bulk acoustic wave device 220 itself may be affected. In other words, the arrangement of the thermally conductive layer 213 in the laterally excited bulk acoustic wave device 210 may provide better resonance characteristics than the arrangement of the thermally conductive layer 213 in the laterally excited bulk acoustic wave device 220, in some applications.

As with the laterally excited bulk acoustic wave device 210, the thermally conductive layer 213 of the laterally excited bulk acoustic wave device 220 can be relatively thin. In some embodiments, the thermally conductive layer 213 can be thinner than the piezoelectric layer 12 and/or the support substrate 17. For example, a thickness of the thermally conductive layer 213 can be in a range between 0.03 μm and 0.3 μm, 0.05 μm and 0.2 μm, or 0.05 μm and 1.05 μm. The thermally conductive layer 213 can be positioned such that the IDT electrodes 14 is located closer to the thermally conductive layer 213 than to the support substrate 17.

FIG. 7D shows a laterally excited bulk acoustic wave device 230 which is a variant of the laterally excited bulk acoustic wave device 210 of FIG. 7B. Unless otherwise noted, the components of FIG. 7D can be the same as or generally similar to the like components disclosed herein. In this variant, the thermally conductive layer 213 is arranged between the piezoelectric layer 12 and the support substrate 17 so as to cover the first surface S1 of the piezoelectric layer 12. The thermally conductive layer 213 can partially or completely cover the first surface S1 of the piezoelectric layer. In some embodiments, the support substrate 17 does not contact the piezoelectric layer 12 directly at all but only indirectly in that it directly contacts the thermally conductive layer 213 which in turn covers the first surface S1 of the piezoelectric layer 12. This variant is especially simple to manufacture as the thermally conductive layer 213 can be provided as an entire layer for which a number of techniques are well known. This may be compared to the variant of FIG. 7B in which the thermally conductive layer 213 is deposited also on vertical surfaces (of the support substrate 17) with all the difficulties this entails, e.g. the problem of equal thickness deposition.

As with the laterally excited bulk acoustic wave devices 210, 220, the thermally conductive layer 213 of the laterally excited bulk acoustic wave device 230 can be relatively thin. In some embodiments, the thermally conductive layer 213 can be thinner than the piezoelectric layer 12 and/or the support substrate 17. For example, a thickness of the thermally conductive layer 213 can be in a range between 0.03 μm and 0.3 μm, 0.05 μm and 0.2 μm, or 0.05 μm and 1.05 μm. The thermally conductive layer 213 can be positioned such that the IDT electrodes 14 is located closer to the thermally conductive layer 213 than to the support substrate 17.

In some embodiments, the arrangements of the thermally conductive layer 213 disclosed herein can be combined. For example, the arrangements of the thermally conductive layer 213 shown in FIGS. 7B, 7C, and 7D may be implemented in various combinations. The illustrated views of FIGS. 7A-7D can depict portions of the respective laterally excited bulk acoustic wave devices 200, 210, 220, 230. Thus, the laterally excited bulk acoustic wave devices 200, 210, 220, 230 can include one or more other components that are not illustrated in FIGS. 7A-7D.

Figure 7E:
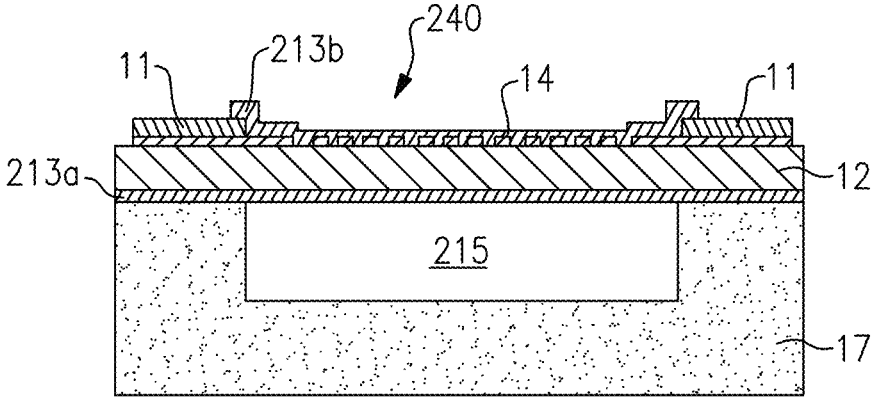
FIG. 7E is a schematic cross section side view of a laterally excited bulk acoustic wave device according to another embodiment.

FIG. 7E is a schematic cross sectional side view of a laterally excited bulk acoustic wave device 240 according to an embodiment. Unless otherwise noted, the components of FIG. 7E can be the same as or generally similar to the like components disclosed herein. The laterally excited bulk acoustic wave device 240 can include a support substrate 17, a piezoelectric layer 12 over the support substrate 17, an interdigital transducer electrode 14 over the piezoelectric layer 12, a first thermally conductive layer 213a between the support substrate 17 and the piezoelectric layer 12, and a second thermally conductive layer 213b over the piezoelectric layer 12. The laterally excited bulk acoustic wave device 240 includes a cavity 215 (e.g., an air cavity). As shown in FIG. 7E, the support substrate 17 can extend under the cavity 215 on a side opposite the piezoelectric layer 12. Features of the support substrate 17 shown in FIG. 7E can be implemented in any of the embodiments of FIGS. 7B to 7D. The cavity 215 can be etched into the support substrate 17. In some other applications, a cavity can be formed over a substantially planar surface of a support substrate.

FIG. 8A illustrates thermal heat dissipation by the acoustic wave device 100 of FIG. 7A during its operation. At the center of the area of heat production the temperature rises to 117° C. (degree Celsius). It is also evident how, due to the small thickness of the thin-film laterally excited bulk acoustic wave device 100, the temperature heat is only very slowly transported away such that the temperature remains comparatively high over the whole width of the piezoelectric layer 12.

By contrast, FIGS. 8B through 8D illustrate thermal heat dissipation for the laterally excited bulk acoustic wave devices 210, 220, 230 according to FIGS. 7B through 7D, respectively, for the same conditions as those in FIG. 8A. An aluminum nitride (AlN) layer was used as the thermally conductive layer 213 in the simulations if FIGS. 8B-8D. It is clearly evident that the piezoelectric layer 12 itself only retains a minor temperature increase with respect to the support substrate 17 and that heat is dissipated quickly and effectively overall. FIGS. 8B-8D indicate that the thermally conductive layer 213 can facilitate heat dissipation in the laterally excited bulk acoustic wave devices 210, 220, 230 so as to prevent and/or mitigate significant increase in temperature in the laterally excited bulk acoustic wave devices 210, 220, 230.

Figure 9B:
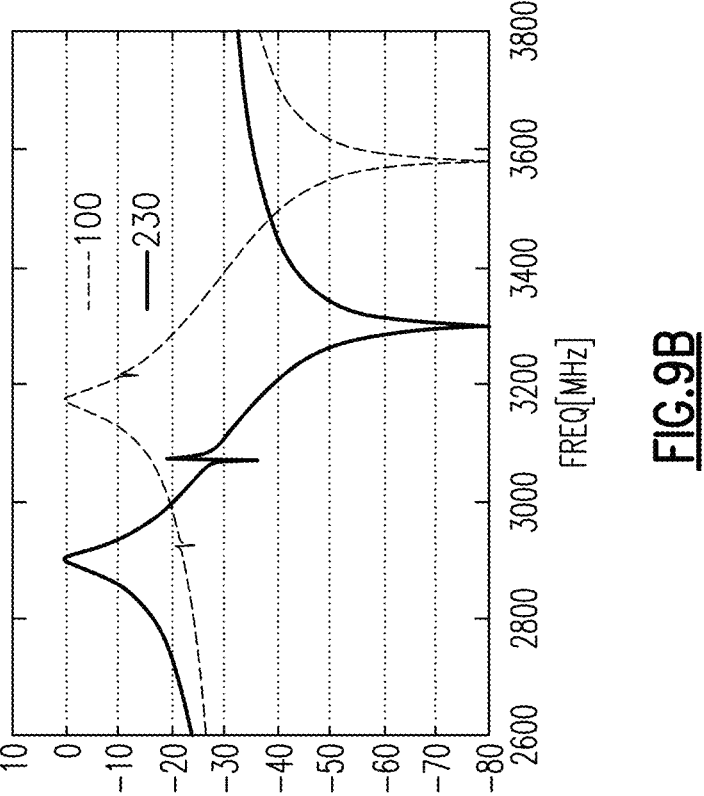
FIG. 9B is a graph showing a comparison of the admittance of the acoustic wave device of FIG. 7A and of the acoustic wave device of FIG. 7C.
Figure 9A:
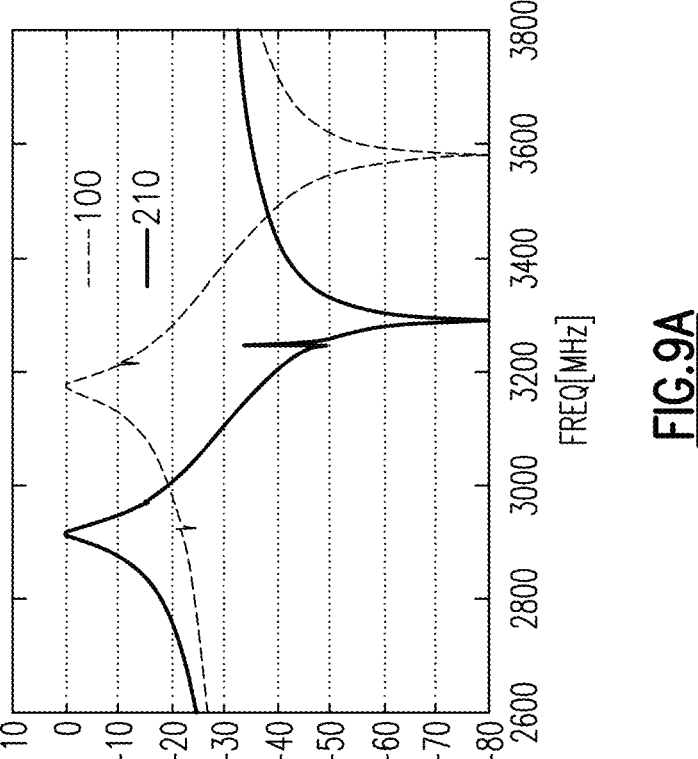
FIG. 9A is a graph showing a comparison of the admittance of the acoustic wave device of FIG. 7A and of the acoustic wave device of FIG. 7B.

FIG. 9A illustrates a comparison of the admittance of the laterally excited bulk acoustic wave device 100 ("baseline") of FIG. 7A and of the laterally excited bulk acoustic wave device 210 of FIG. 7B, wherein the graph shows admittance over frequency. The admittance curves are shifted in frequency but otherwise almost identical in shape, indicating that the improved thermal dissipation by the addition of the thermally conductive layer 213 does not come with deteriorated admittance characteristics. For the simulations, the following values have been assumed: the wavelength (L) is 7.8 micrometers (μm), lithium niobate (LN) is used as the piezoelectric layer and a thickness of the piezoelectric layer (hLN) is 0.6 micrometers (μm), a thickness of the interdigital transducer electrode (hIDT) is 0.05 micrometers (μm), an aluminum nitride (AlN) layer was used as the thermally conductive layer 213 and a thickness of the thermally conductive layer 213 (hAlN) is 0.1 micrometers (μm), the duty factor (DF) is 0.5. The duty factor DF is calculated as:

$$DF=W/(\lambda/2),$$

wherein W is the width of each "finger" of the IDT electrodes 14, and λ is the pitch, as is illustrated in FIG. 1B. The same values have been employed for FIG. 9B and, excepting the duty factor DF, in FIGS. 10A and FIG. 10B. The height (or: thickness) of the thermally conductive layer 213 is preferably in a range between 30 nanometers (nm) and 300 nanometers (nm), more preferably between 50 nanometers (nm) and 200 nanometers (nm), most preferably between 75 nanometers (nm) and 150 nanometers (nm).

FIG. 9B illustrates a comparison of the admittance of the laterally excited bulk acoustic wave device 100 ("baseline") of FIG. 7A and of the laterally excited bulk acoustic wave device 220 of FIG. 7C, wherein the graph shows admittance over frequency. Again, the admittance curves are shifted in frequency but otherwise almost identical in shape.

Figures 10A, 10B:
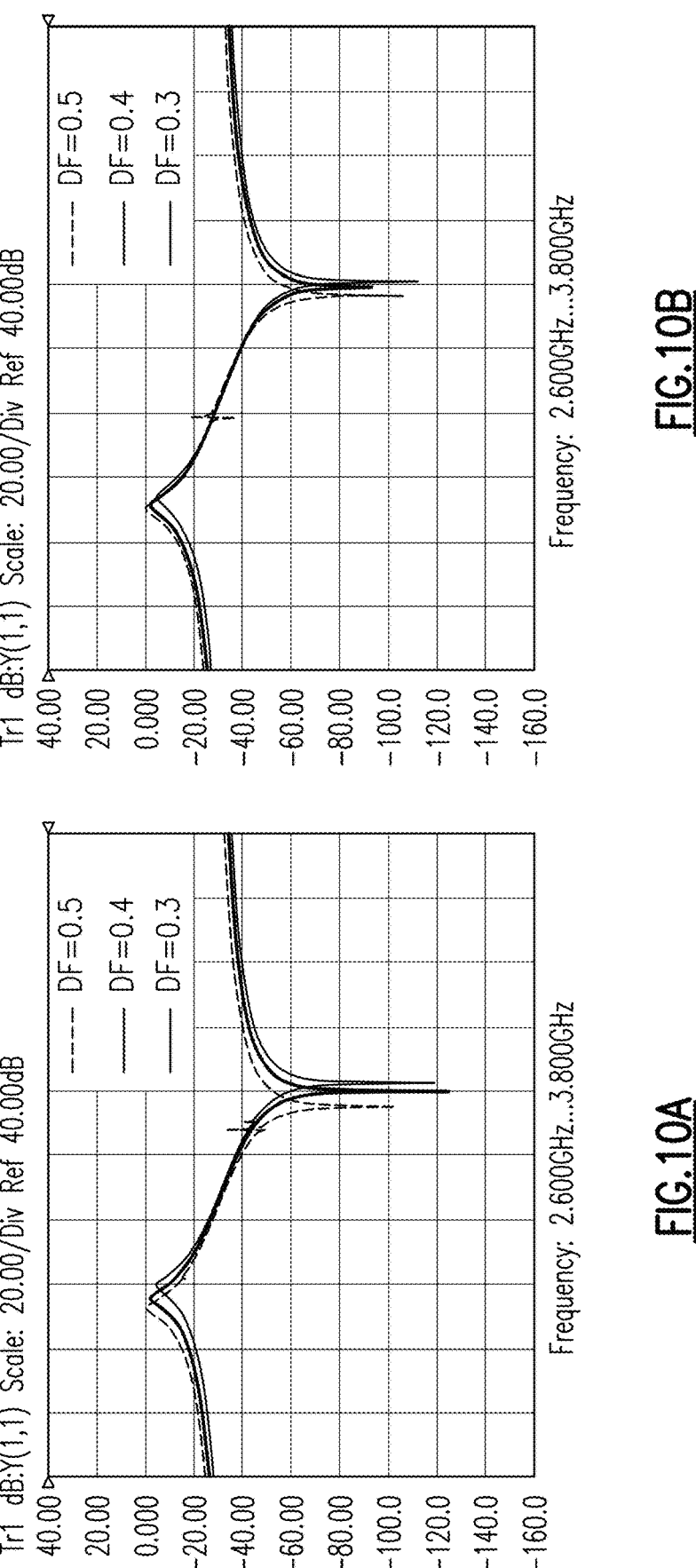
FIG. 10A illustrates a comparison of the admittance of the acoustic wave device of FIG. 7B for different duty factors, DF.
FIG. 10B illustrates a comparison of the admittance of the acoustic wave device of FIG. 7C for different duty factors, DF.

FIG. 10A illustrates a comparison of the admittance of the acoustic wave device 210 of FIG. 7B for different duty factors, DF.

FIG. 10B illustrates a comparison of the admittance of the acoustic wave device 220 of FIG. 7C for different duty factors, DF. FIGS. 10A and 10B clearly show that in-band spurious emission can be reduced with choices of lower duty factors, DF. Therefore, preferably the acoustic wave device 210, 220, 230 (more specifically: the IDT electrode 14) is designed and configured such as to have a duty factor of DF=0.5 or lower, preferably of DF=0.4 or lower, more preferably of 0.3 or lower.

Acoustic wave devices (or: acoustic wave resonators) disclosed herein can be implemented in a variety of different filter topologies. Example filter topologies include without limitation, ladder filters, lattice filters, hybrid ladder lattice filters, filters that include ladder stages and a multi-mode surface acoustic wave filter, and the like. Such filters can be band pass filters. In some other applications, such filters include band stop filters. In some instances, acoustic wave devices disclosed herein can be implemented in filters with one or more other types of resonators and/or with passive impedance elements, such as one or more inductors and/or one or more capacitors. Some example filter topologies will now be discussed with reference to FIGS. 11 to 16. Any suitable combination of features of the filter topologies of FIGS. 14 to 16 can be implemented together with each other and/or with other filter topologies.

Figure 11:
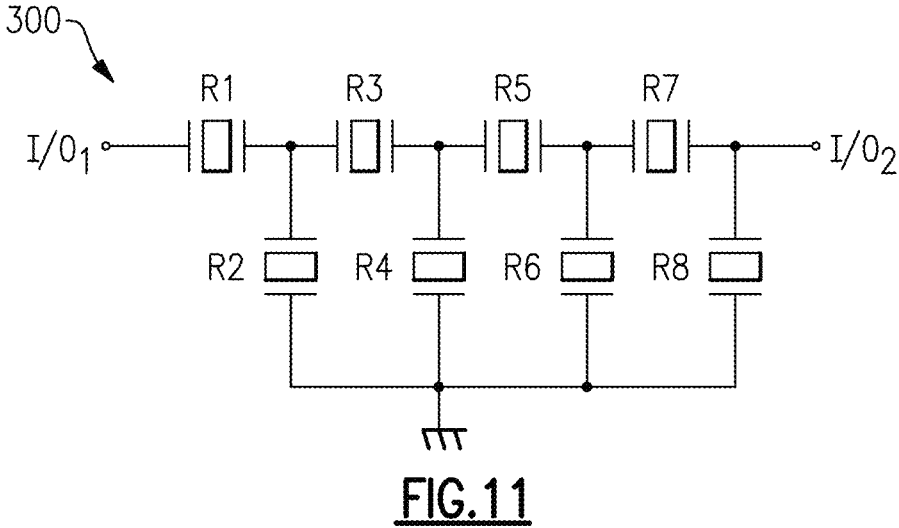
FIG. 11 is a schematic diagram of a ladder filter that includes a laterally excited bulk acoustic wave resonator.

FIG. 11 is a schematic diagram of a ladder filter 300 that includes a laterally excited bulk acoustic wave resonator according to an embodiment. The ladder filter 300 is an example topology that can implement a band pass filter formed from acoustic wave resonators. In a band pass filter with a ladder filter topology, the shunt resonators can have lower resonant frequencies than the series resonators. The ladder filter 300 can be arranged to filter a radio frequency signal. As illustrated, the ladder filter 300 includes series acoustic wave resonators R1 R3, R5, and R7 and shunt acoustic wave resonators R2, R4, R6, and R8 coupled between a first input/output port I/O1 and a second input/output port I/O2. Any suitable number of series acoustic wave resonators can be in included in a ladder filter. Any suitable number of shunt acoustic wave resonators can be included in a ladder filter.

One or more of the acoustic wave resonators of the ladder filter 300 can include a laterally excited bulk acoustic wave filter according to an embodiment. In certain applications, all acoustic resonators of the ladder filter 300 can be laterally excited bulk acoustic wave resonators in accordance with any suitable principles and advantages disclosed herein. According to some applications, the ladder filter 300 can include at least one laterally excited bulk acoustic wave device according to one embodiment and at least one other laterally excited bulk acoustic wave device according to another embodiment.

The first input/output port I/O1 can a transmit port and the second input/output port I/O2 can be an antenna port. Alternatively, first input/output port I/O1 can a receive port and the second input/output port I/O2 can be an antenna port.

Figure 12:
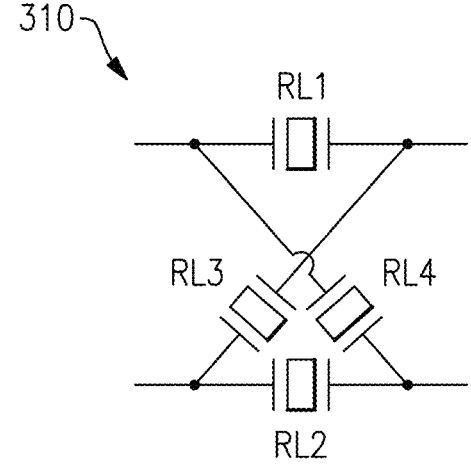
FIG. 12 is a schematic diagram of a lattice filter that includes a laterally excited bulk acoustic wave resonator.

FIG. 12 is a schematic diagram of a lattice filter 310 that includes a laterally excited bulk acoustic wave resonator according to an embodiment. The lattice filter 310 is an example topology of a band pass filter formed from acoustic wave resonators. The lattice filter 310 can be arranged to filter an RF signal. As illustrated, the lattice filter 310 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 310 has a balanced input and a balanced output. One or more of the illustrated acoustic wave resonators RL1 to RL4 can be a laterally excited bulk acoustic wave resonator in accordance with any suitable principles and advantages disclosed herein.

Figure 13:
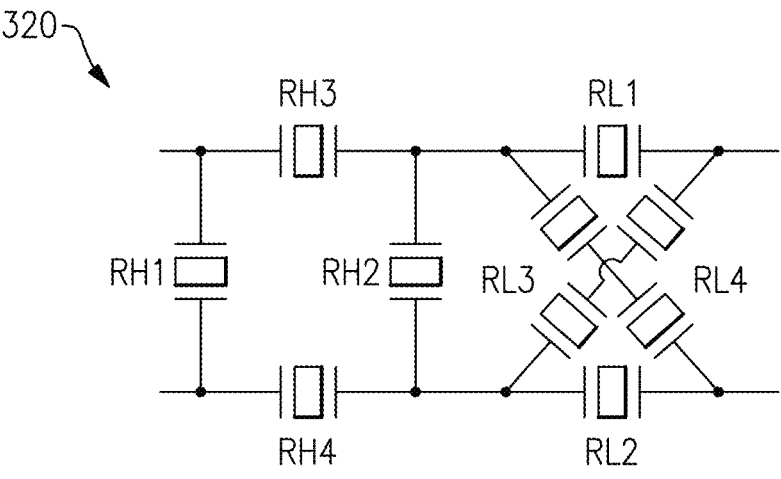
FIG. 13 is a schematic diagram of a hybrid ladder lattice filter that includes a laterally excited bulk acoustic wave resonator.

FIG. 13 is a schematic diagram of a hybrid ladder and lattice filter 320 that includes a laterally excited bulk acoustic wave resonator according to an embodiment. The illustrated hybrid ladder and lattice filter 320 includes series acoustic resonators RL1, RL2, RH3, and RH4 and shunt acoustic resonators RL3, RL4, RH1, and RH2. The hybrid ladder and lattice filter 320 includes one or more laterally excited bulk acoustic wave resonators in accordance with any suitable principles and advantages disclosed herein. For example, the series resonators RL1, RL2, RH3, and RH4 and the shunt resonators RL3, RL4, RH1, and RH2 can each be a laterally excited bulk acoustic wave resonator according to an embodiment.

According to certain applications, a laterally excited bulk acoustic wave resonator can be included in filter that also includes one or more inductors and one or more capacitors.

The laterally excited bulk acoustic wave resonators disclosed herein can be implemented in a standalone filter and/or in a filter in any suitable multiplexer. Such filters can be any suitable topology, such as any filter topology of FIGS. 24 to 26. The filter can be a band pass filter arranged to filter a 4G LTE band and/or 5G NR band. Examples of a standalone filter and multiplexers will be discussed with reference to FIGS. 17A to 17E. Any suitable principles and advantages of these filters and/or multiplexers can be implemented together with each other.

FIG. 14A is schematic diagram of an acoustic wave filter 330. The acoustic wave filter 330 is a band pass filter. The acoustic wave filter 330 is arranged to filter a radio frequency. The acoustic wave filter 330 includes one or more acoustic wave devices coupled between a first input/output port RF_IN and a second input/output port RF_OUT. The acoustic wave filter 330 includes a laterally excited bulk acoustic wave resonator according to an embodiment.

FIG. 14B is a schematic diagram of a duplexer 332 that includes an acoustic wave filter according to an embodiment. The duplexer 332 includes a first filter 330A and a second filter 330B coupled together at a common node COM. One of the filters of the duplexer 332 can be a transmit filter and the other of the filters of the duplexer 332 can be a receive filter. In some other instances, such as in a diversity receive application, the duplexer 332 can include two receive filters. Alternatively, the duplexer 332 can include two transmit filters. The common node COM can be an antenna node.

The first filter 330A is an acoustic wave filter arranged to filter a radio frequency signal. The first filter 330A includes one or more acoustic wave resonators coupled between a first radio frequency node RF1 and the common node COM. The first radio frequency node RF1 can be a transmit node or a receive node. The first filter 330A includes a laterally excited bulk acoustic wave resonator in accordance with any suitable principles and advantages disclosed herein.

The second filter 330B can be any suitable filter arranged to filter a second radio frequency signal. The second filter 330B can be, for example, an acoustic wave filter, an acoustic wave filter that includes a laterally exited bulk acoustic wave resonator, an LC filter, a hybrid acoustic wave LC filter, or the like. The second filter 330B is coupled between a second radio frequency node RF2 and the common node. The second radio frequency node RF2 can be a transmit node or a receive node.

Although example embodiments may be discussed with filters or duplexers for illustrative purposes, any suitable principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. Multiplexers can include filters having different passbands. Multiplexers can include any suitable number of transmit filters and any suitable number of receive filters. For example, a multiplexer can include all receive filters, all transmit filters, or one or more transmit filters and one or more receive filters. One or more filters of a multiplexer can include any suitable number of laterally excited bulk acoustic wave devices.

FIG. 14C is a schematic diagram of a multiplexer 334 that includes an acoustic wave filter according to an embodiment. The multiplexer 334 includes a plurality of filters 330A to 330N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. As illustrated, the filters 330A to 330N each have a fixed electrical connection to the common node COM. This can be referred to as hard multiplexing or fixed multiplexing. Filters have fixed electrical connections to the common node in hard multiplexing applications.

The first filter 330A is an acoustic wave filter arranged to filter a radio frequency signal. The first filter 330A can include one or more acoustic wave devices coupled between a first radio frequency node RF1 and the common node COM. The first radio frequency node RF1 can be a transmit node or a receive node. The first filter 330A includes a laterally excited bulk acoustic wave resonator in accordance with any suitable principles and advantages disclosed herein. The other filter(s) of the multiplexer 334 can include one or more acoustic wave filters, one or more acoustic wave filters that include a laterally excited bulk acoustic wave resonator, one or more LC filters, one or more hybrid acoustic wave LC filters, or any suitable combination thereof.

Figure 14D:
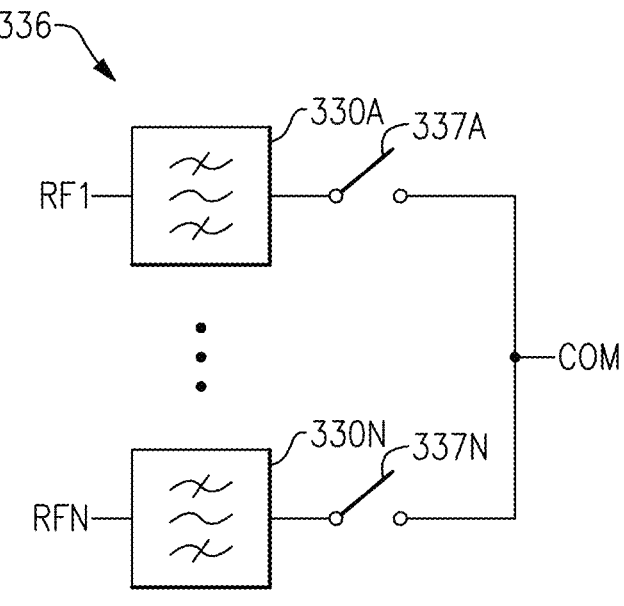
FIG. 14D is a schematic diagram of a multiplexer with switched multiplexing.

FIG. 14D is a schematic diagram of a multiplexer 336 that includes an acoustic wave filter according to an embodiment. The multiplexer 336 is like the multiplexer 334 of FIG. 14C, except that the multiplexer 336 implements switched multiplexing. In switched multiplexing, a filter is coupled to a common node via a switch. In the multiplexer 336, the switch 337A to 337N can selectively electrically connect respective filters 330A to 330N to the common node COM. For example, the switch 337A can selectively electrically connect the first filter 330A the common node COM via the switch 337A. Any suitable number of the switches 337A to 337N can electrically a respective filters 330A to 330N to the common node COM in a given state. Similarly, any suitable number of the switches 337A to 337N can electrically isolate a respective filter 330A to 330N to the common node COM in a given state. The functionality of the switches 337A to 337N can support various carrier aggregations.

Figure 14E:
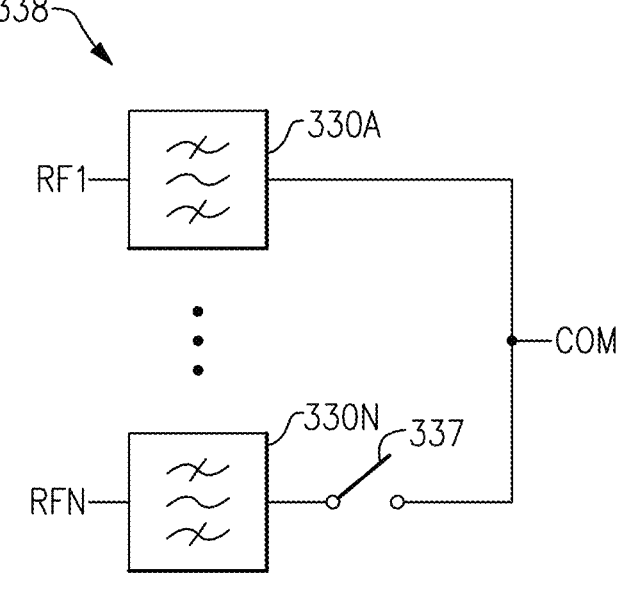
FIG. 14E is a schematic diagram of a multiplexer with a combination of hard multiplexing and switched multiplexing.

FIG. 14E is a schematic diagram of a multiplexer 338 that includes an acoustic wave filter according to an embodiment. The multiplexer 338 illustrates that a multiplexer can include any suitable combination of hard multiplexed and switched multiplexed filters. One or more laterally excited bulk acoustic wave devices can be included in a filter that is hard multiplexed to the common node of a multiplexer. Alternatively or additionally, one or more laterally excited bulk acoustic wave devices can be included in a filter that is switch multiplexed to the common node of a multiplexer.

The acoustic wave devices disclosed herein can be implemented in a variety of packaged modules. Some example packaged modules will now be disclosed in which any suitable principles and advantages of the acoustic wave devices, or acoustic wave components disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 18 to 22 are schematic block diagrams of illustrative packaged modules according to certain embodiments. Any suitable combination of features of these packaged modules can be implemented with each other. While duplexers are illustrated in the example packaged modules of FIGS. 19, 20, and 22, any other suitable multiplexer that includes a plurality of filters coupled to a common node and/or standalone filter can be implemented instead of one or more duplexers. For example, a quadplexer can be implemented in certain applications. As another example, one or more filters of a packaged module can be arranged as a transmit filter or a receive filter that is not included in a multiplexer.

Figure 15:
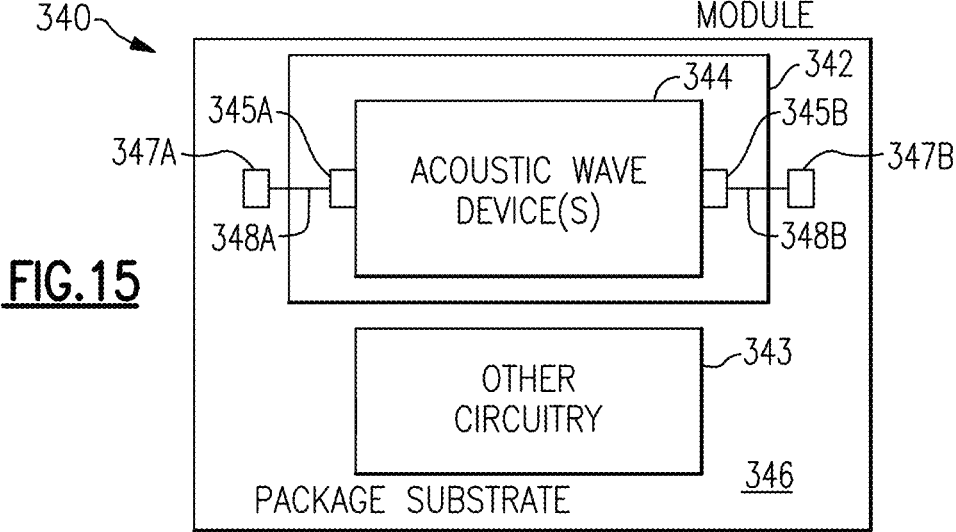
FIG. 15 is a schematic diagram of a radio frequency module that includes an acoustic wave filter.

FIG. 15 is a schematic diagram of a radio frequency module 340 that includes an acoustic wave component 342 according to an embodiment. The illustrated radio frequency module 340 includes the acoustic wave component 342 and other circuitry 343. The acoustic wave component 342 can include one or more acoustic wave devices in accordance with any suitable combination of features of the acoustic wave filters disclosed herein. The acoustic wave component 342 can include an acoustic wave filter that includes a plurality of laterally excited bulk acoustic wave resonators, for example.

The acoustic wave component 342 shown in FIG. 15 includes one or more acoustic wave devices 344 and terminals 345A and 345B. The one or more acoustic wave devices 344 includes an acoustic wave device implemented in accordance with any suitable principles and advantages disclosed herein. The terminals 345A and 344B can serve, for example, as an input contact and an output contact. Although two terminals are illustrated, any suitable number of terminals can be implemented for a particular application. The acoustic wave component 342 and the other circuitry 343 are on a common packaging substrate 346 in FIG. 15. The package substrate 346 can be a laminate substrate. The terminals 345A and 345B can be electrically connected to contacts 347A and 347B, respectively, on the packaging substrate 346 by way of electrical connectors 348A and 348B, respectively. The electrical connectors 348A and 348B can be bumps or wire bonds, for example.

The other circuitry 343 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 343 can be electrically connected to the one or more acoustic wave devices 344. The radio frequency module 340 can include one or more packaging structures to, for example, provide protection and/or facilitate easier handling of the radio frequency module 340. Such a packaging structure can include an overmold structure formed over the packaging substrate 346. The overmold structure can encapsulate some or all of the components of the radio frequency module 340.

Figure 16:
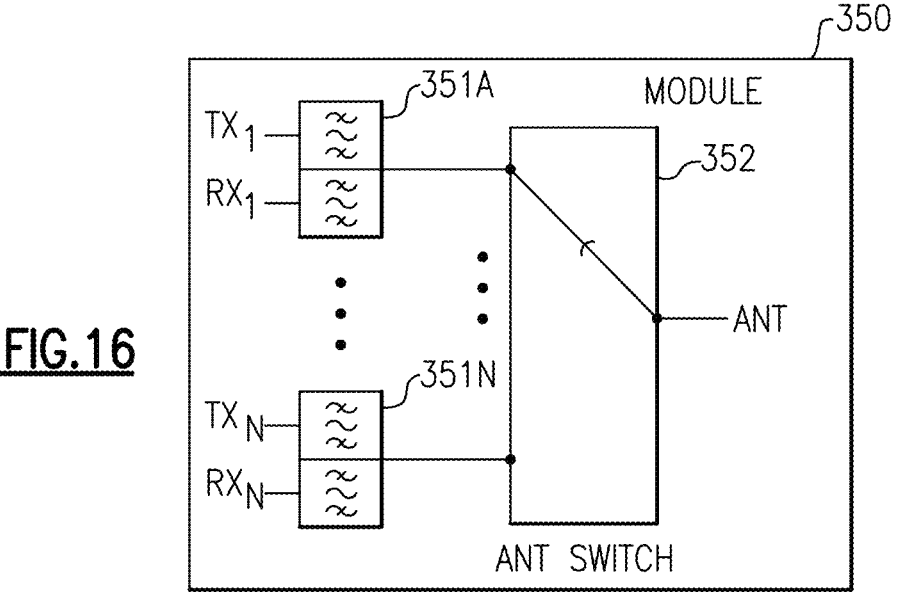
FIG. 16 is a schematic block diagram of a module that includes an antenna switch and duplexers.

FIG. 16 is a schematic block diagram of a module 350 that includes duplexers 351A to 351N and an antenna switch 352. One or more filters of the duplexers 351A to 351N can include an acoustic wave device in accordance with any suitable principles and advantages disclosed herein. Any suitable number of duplexers 351A to 351N can be implemented. The antenna switch 352 can have a number of throws corresponding to the number of duplexers 351A to 351N. The antenna switch 352 can include one or more additional throws coupled to one or more filters external to the module 350 and/or coupled to other circuitry. The antenna switch 352 can electrically couple a selected duplexer to an antenna port of the module 350.

Figures 17, 18:
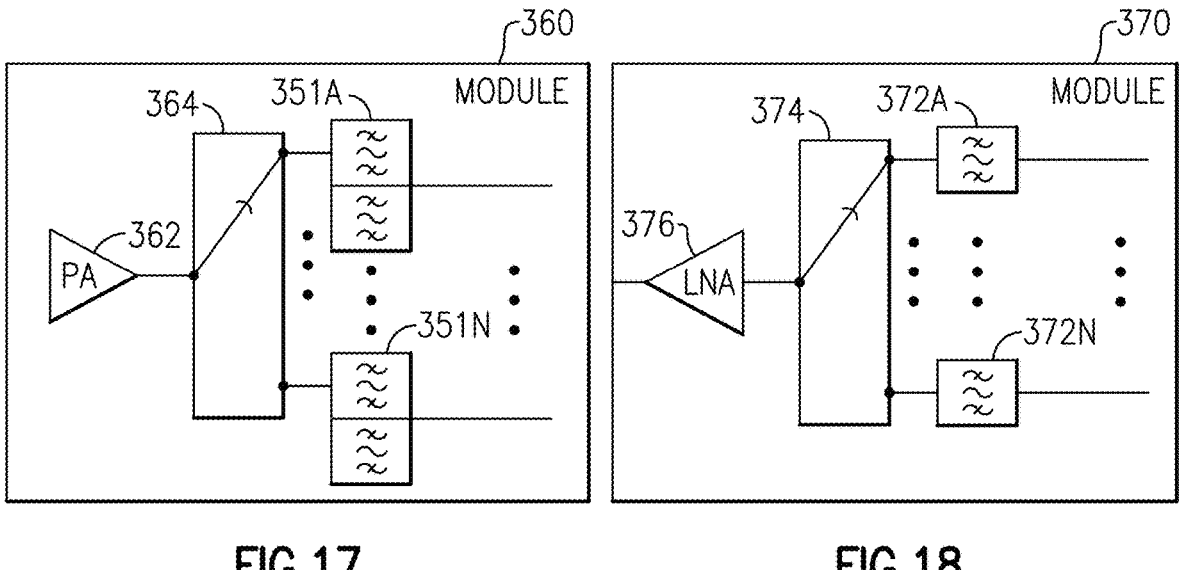
FIG. 17 is a schematic block diagram of a module that includes a power amplifier, a radio frequency switch, and duplexers.
FIG. 18 is a schematic block diagram of a module that includes a low noise amplifier, a radio frequency switch, and filters.

FIG. 17 is a schematic block diagram of a module 360 that includes a power amplifier 362, a radio frequency switch 364, and duplexers 351A to 351N according to an embodiment. The power amplifier 362 can amplify a radio frequency signal. The radio frequency switch 364 can be a multi-throw radio frequency switch. The radio frequency switch 364 can electrically couple an output of the power amplifier 362 to a selected transmit filter of the duplexers 351A to 351N. One or more filters of the duplexers 351A to 351N can include an acoustic wave device in accordance with any suitable principles and advantages disclosed herein. Any suitable number of duplexers 351A to 351N can be implemented.

FIG. 18 is a schematic block diagram of a module 370 that includes filters 372A to 372N, a radio frequency switch 374, and a low noise amplifier 376 according to an embodiment. One or more filters of the filters 372A to 372N can include any suitable number of acoustic wave devices in accordance with any suitable principles and advantages disclosed herein. Any suitable number of filters 372A to 372N can be implemented. The illustrated filters 372A to 372N are receive filters. In some embodiments (not illustrated), one or more of the filters 372A to 372N can be included in a multiplexer that also includes a transmit filter. The radio frequency switch 374 can be a multi-throw radio frequency switch. The radio frequency switch 374 can electrically couple an output of a selected filter of filters 372A to 372N to the low noise amplifier 376. In some embodiments (not illustrated), a plurality of low noise amplifiers can be implemented. The module 370 can include diversity receive features in certain applications.

Figure 19:
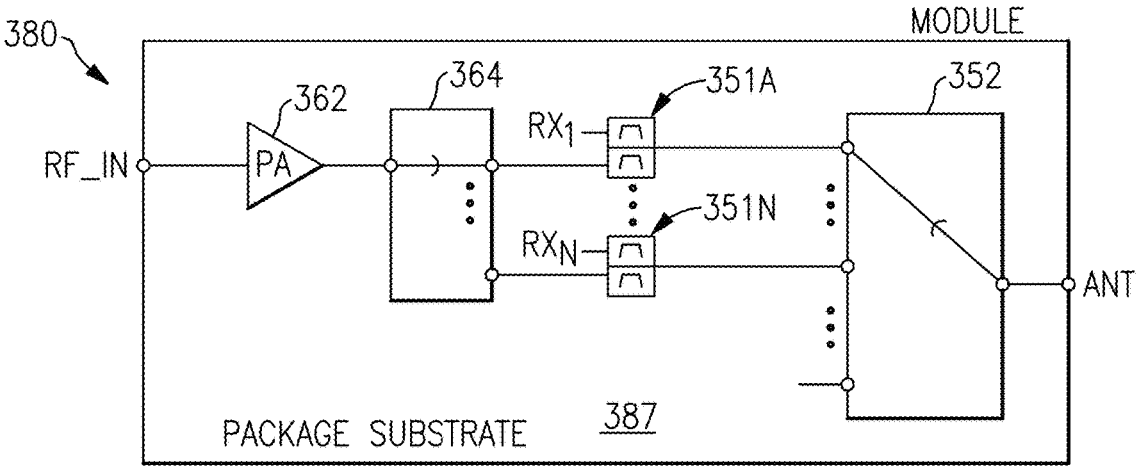
FIG. 19 is a schematic diagram of a radio frequency module that includes an acoustic wave filter.

FIG. 19 is a schematic diagram of a radio frequency module 380 that includes an acoustic wave filter according to an embodiment. As illustrated, the radio frequency module 380 includes duplexers 351A to 351N, a power amplifier 362, a select switch 364, and an antenna switch 352. The radio frequency module 380 can include a package that encloses the illustrated elements. The illustrated elements can be disposed on a common packaging substrate 387. The packaging substrate 387 can be a laminate substrate, for example. A radio frequency module that includes a power amplifier can be referred to as a power amplifier module. A radio frequency module can include a subset of the elements illustrated in FIG. 19 and/or additional elements. The radio frequency module 380 may include any one of the acoustic wave filters in accordance with any suitable principles and advantages disclosed herein.

The duplexers 351A to 351N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave device in accordance with any suitable principles and advantages disclosed herein. Similarly, one or more of the receive filters can include an acoustic wave device in accordance with any suitable principles and advantages disclosed herein. Although FIG. 19 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 362 can amplify a radio frequency signal. The illustrated switch 364 is a multi-throw radio frequency switch. The switch 364 can electrically couple an output of the power amplifier 362 to a selected transmit filter of the transmit filters of the duplexers 351A to 351N. In some instances, the switch 364 can electrically connect the output of the power amplifier 362 to more than one of the transmit filters. The antenna switch 352 can selectively couple a signal from one or more of the duplexers 351A to 351N to an antenna port ANT. The duplexers 351A to 351N can be associated with different frequency bands and/or different modes of operation (e.g., different power modes, different signaling modes, etc.).

Figure 20:
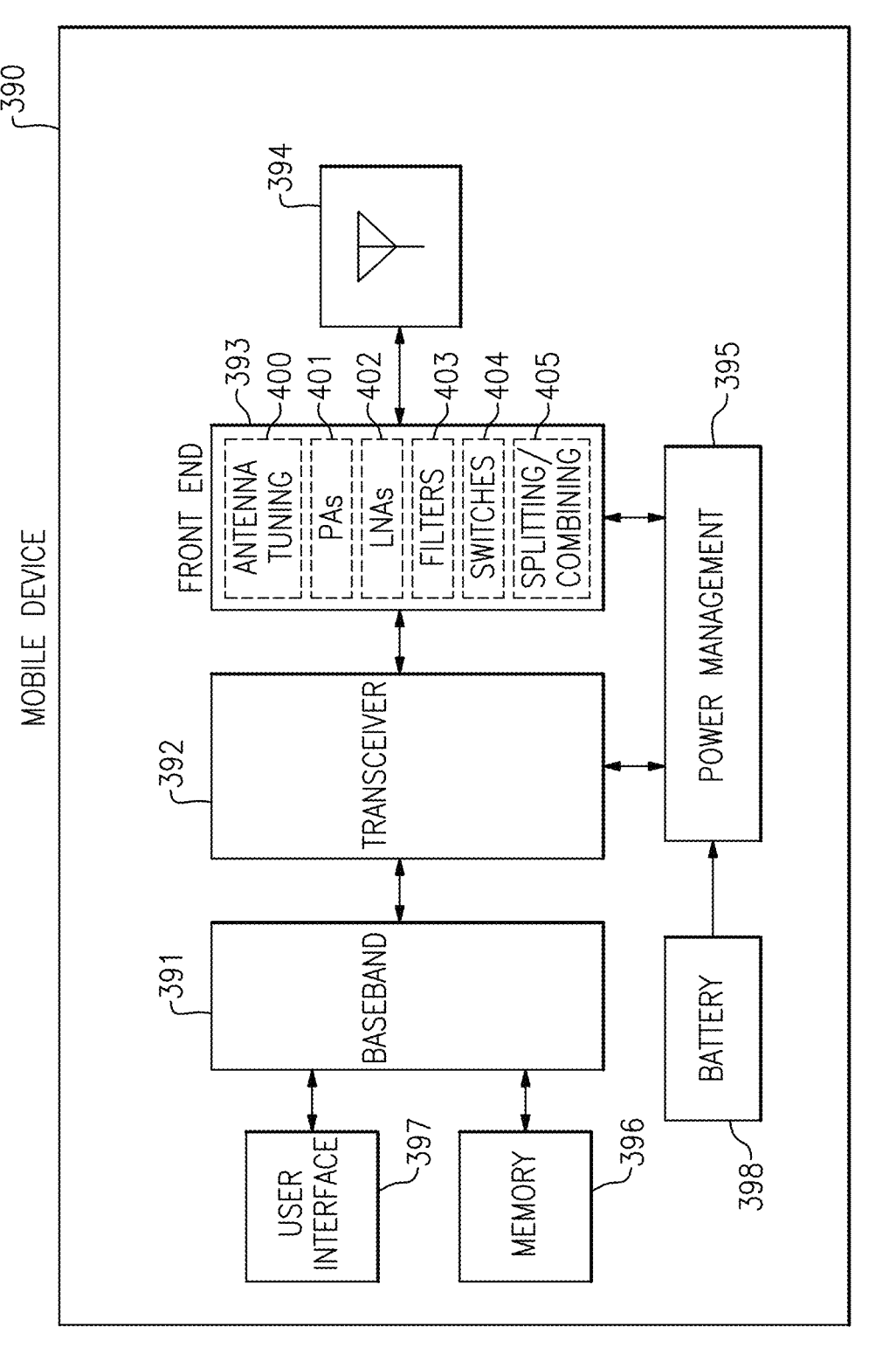
FIG. 20 is a schematic block diagram of a wireless communication device that includes a filter.

The acoustic wave devices disclosed herein can be implemented in wireless communication devices. FIG. 20 is a schematic block diagram of a wireless communication device 390 that includes a filter according to an embodiment. The wireless communication device 390 can be a mobile device. The wireless communication device 390 can be any suitable wireless communication device. For instance, a wireless communication device 390 can be a mobile phone, such as a smart phone. As illustrated, the wireless communication device 390 includes a baseband system 391, a transceiver 392, a front end system 393, antennas 394, a power management system 395, a memory 396, a user interface 397, and a battery 398.

The wireless communication device 390 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 392 generates RF signals for transmission and processes incoming RF signals received from the antennas 394. Various functionalities associated with the transmission and receiving of RF signals can be achieved by one or more components that are collectively represented in FIG. 20 as the transceiver 392. In one example, separate components (for instance, separate circuits or dies) can be provided for handling certain types of RF signals.

The front end system 393 aids in conditioning signals transmitted to and/or received from the antennas 394. In the illustrated embodiment, the front end system 393 includes antenna tuning circuitry 400, power amplifiers (PAs) 401, low noise amplifiers (LNAs) 402, filters 403, switches 404, and signal splitting/combining circuitry 405. However, other implementations are possible. The filters 403 can include one or more acoustic wave filters that include any suitable number of laterally excited bulk acoustic wave devices in accordance with any suitable principles and advantages disclosed herein. The filters 403 can include bandpass filters configured to filter a signal in a particular operating band, such as an operating band for 4G LTE, 5G NR, or Wi-Fi. In some instances, one or more of the filters 403 can filter signals in two or more particular operating bands. One or more of the filters 403 can be arranged to filtering signals in dual connectivity applications.

For example, the front end system 393 can provide a number of functionalities, including, but not limited to, amplifying signals for transmission, amplifying received signals, filtering signals, switching between different bands, switching between different power modes, switching between transmission and receiving modes, duplexing of signals, multiplexing of signals, or any suitable combination thereof.

In certain implementations, the wireless communication device 390 supports carrier aggregation, thereby providing flexibility to increase peak data rates. Carrier aggregation can be used for Frequency Division Duplexing (FDD) and/or Time Division Duplexing (TDD), and may be used to aggregate a plurality of carriers and/or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 394 can include antennas used for a wide variety of types of communications. For example, the antennas 394 can include antennas for transmitting and/or receiving signals associated with a wide variety of frequencies and communications standards.

In certain implementations, the antennas 394 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The wireless communication device 390 can operate with beamforming in certain implementations. For example, the front end system 393 can include amplifiers having controllable gain and phase shifters having controllable phase to provide beam formation and directivity for transmission and/or reception of signals using the antennas 394. For example, in the context of signal transmission, the amplitude and phases of the transmit signals provided to the antennas 394 are controlled such that radiated signals from the antennas 394 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 394 from a particular direction. In certain implementations, the antennas 394 include one or more arrays of antenna elements to enhance beamforming.

The baseband system 391 is coupled to the user interface 397 to facilitate processing of various user input and output (I/O), such as voice and data. The baseband system 391 provides the transceiver 392 with digital representations of transmit signals, which the transceiver 392 processes to generate RF signals for transmission. The baseband system 391 also processes digital representations of received signals provided by the transceiver 392. As shown in FIG. 20, the baseband system 391 is coupled to the memory 396 of facilitate operation of the wireless communication device 390.

The memory 396 can be used for a wide variety of purposes, such as storing data and/or instructions to facilitate the operation of the wireless communication device 390 and/or to provide storage of user information.

The power management system 395 provides a number of power management functions of the wireless communication device 390. In certain implementations, the power management system 395 includes a PA supply control circuit that controls the supply voltages of the power amplifiers 401. For example, the power management system 395 can be configured to change the supply voltage(s) provided to one or more of the power amplifiers 401 to improve efficiency, such as power added efficiency (PAE).

As shown in FIG. 20, the power management system 395 receives a battery voltage from the battery 398. The battery 398 can be any suitable battery for use in the wireless communication device 390, including, for example, a lithium-ion battery.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 25 GHz.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel filters, multiplexer, devices, modules, wireless communication devices, apparatus, methods, and systems described herein may be embodied in a variety of other forms. Furthermore, various omissions, substitutions and changes in the form of the filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic wave device comprising:
a membrane structure including a piezoelectric layer, an interdigital transducer electrode arranged on the piezoelectric layer, signal lines, and a thermally conductive layer arranged at least partially in contact with the piezoelectric layer; and
a support substrate connected to the membrane structure and configured such that a cavity is provided between the support substrate and the membrane structure, the cavity being on an opposite side of the piezoelectric layer than the interdigital transducer electrode, and the thermally conductive layer covering at least a portion of the interdigital transducer electrode and covering at least a portion of the signal lines.

2. The acoustic wave device of claim 1 wherein the interdigital transducer electrode is sandwiched between the thermally conductive layer and the piezoelectric layer.

3. The acoustic wave device of claim 1 wherein the thermally conductive layer includes a metal or a semiconductor with high thermal conductivity.

4. The acoustic wave device of claim 1 wherein the thermally conductive layer has a thermal conductivity of 100 W/(m*K) or more.

5. The acoustic wave device of claim 1 wherein the thermally conductive layer includes at least one of aluminum, molybdenum, tungsten, ruthenium, aluminum silicide, aluminum nitride, silicon, diamond-like carbon, or silicon nitride.

6. The acoustic wave device of claim 1 wherein the interdigital transducer electrode has a duty factor of 0.5 or lower.

7. The acoustic wave device of claim 1 wherein the thermally conductive layer has a thickness in a range from 30 nanometers to 300 nanometers.

8. The acoustic wave device of claim 1 wherein the acoustic wave device is a laterally excited bulk acoustic wave resonator.

9. The acoustic wave device of claim 8 wherein the acoustic wave device is configured as an A1 mode laterally excited bulk acoustic wave resonator.

10. The acoustic wave device of claim 8 wherein the piezoelectric layer includes lithium niobate.

11. The acoustic wave device of claim 8 wherein the piezoelectric layer includes a lithium niobate crystal cut with a surface normal orientation of (α, β, γ), with α between −10° and +10°, β between −10° and +10°, and γ between 80° and 100° in Euler angles.

12. The acoustic wave device of claim 8 wherein the piezoelectric layer includes a lithium niobate crystal cut with a surface normal orientation of (α, β, γ)=(0°, 0°, 90°) in Euler angles.

13. A wireless communication device comprising:
the acoustic wave device of claim 1;
an antenna operatively coupled to the acoustic wave device;
a radio frequency amplifier operatively coupled to the acoustic wave device and configured to amplify a radio frequency signal; and
a transceiver in communication with the radio frequency amplifier.

14. The wireless communication device of claim 13 further comprising a baseband processor in communication with the transceiver.

15. An acoustic wave device comprising:
a membrane structure including a piezoelectric layer, an interdigital transducer electrode arranged on the piezoelectric layer, and a thermally conductive layer arranged at least partially in contact with the piezoelectric layer, the thermally conductive layer is arranged at a first side of the piezoelectric layer opposite to a second side on which the interdigital transducer electrode is arranged on the piezoelectric layer; and
a support substrate connected to the membrane structure and configured such that a cavity is provided between the support substrate and the membrane structure, the cavity being on an opposite side of the piezoelectric layer than the interdigital transducer electrode, and the thermally conductive layer extends along a surface of the support substrate facing the cavity.

16. The acoustic wave device of claim 15 wherein the thermally conductive layer has a thermal conductivity of 100 W/(m*K) or more.

17. The acoustic wave device of claim 15 wherein the interdigital transducer electrode has a duty factor of 0.4 or lower.

18. A radio frequency module comprising:
an acoustic wave device including a membrane structure and a support substrate, the membrane structure including a piezoelectric layer, an interdigital transducer electrode arranged on the piezoelectric layer, and a thermally conductive layer arranged at least partially in contact with the piezoelectric layer, the support substrate being connected to the membrane structure and configured such that a cavity is provided between the support substrate and the membrane structure, the cavity being on an opposite side of the piezoelectric layer than the interdigital transducer electrode; and
a radio frequency circuit element coupled to the acoustic wave device, the acoustic wave device and the radio frequency circuit element being enclosed within a common package.

19. The radio frequency module of claim 18 wherein the radio frequency circuit element is a radio frequency amplifier arranged to amplify a radio frequency signal.

20. The radio frequency module of claim 18 wherein the radio frequency circuit element is a switch configured to selectively couple the acoustic wave device to an antenna port of the radio frequency module.

* * * * *